United States Patent
Fujiwara et al.

(10) Patent No.: US 10,501,860 B2
(45) Date of Patent: Dec. 10, 2019

(54) METHOD AND APPARATUS FOR ELECTROPLATING A METAL ONTO A SUBSTRATE

(71) Applicant: Atotech Deutschland GmbH, Berlin (DE)

(72) Inventors: Toshia Fujiwara, Tokyo (JP); Horst Brüggmann, Berlin (DE); Roland Herold, Berlin (DE); Thomas Schiwon, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 255 days.

(21) Appl. No.: 15/533,320

(22) PCT Filed: Dec. 2, 2015

(86) PCT No.: PCT/EP2015/078345
§ 371 (c)(1),
(2) Date: Jun. 5, 2017

(87) PCT Pub. No.: WO2016/087507
PCT Pub. Date: Jun. 9, 2016

(65) Prior Publication Data
US 2018/0010258 A1   Jan. 11, 2018

(30) Foreign Application Priority Data
Dec. 5, 2014 (EP) .................................. 14196505

(51) Int. Cl.
C25D 3/38 (2006.01)
C25D 5/18 (2006.01)
(Continued)

(52) U.S. Cl.
CPC ................ C25D 5/18 (2013.01); C25D 3/38 (2013.01); C25D 21/12 (2013.01); H05K 3/4076 (2013.01);
(Continued)

(58) Field of Classification Search
CPC ...................................................... C25D 5/18
See application file for complete search history.

(56) References Cited

U.S. PATENT DOCUMENTS 6,132,584 A   10/2000   Hubel
6,179,984 B1   1/2001   Maurer
(Continued)

FOREIGN PATENT DOCUMENTS

DE   4134632 C1   4/1993

OTHER PUBLICATIONS

Leisner P et al., "Recent progress in pulse reversal plating of copper for electronics applications"; Institute of Metal Finishing; vol. 85, pp. 41-45, 2007.

Primary Examiner — Brian W Cohen
(74) Attorney, Agent, or Firm — Bonini IP Law, LLC; Frank J. Bonini, Jr.

(57) ABSTRACT

Method for electroplating a metal onto a flat substrate P. Surfaces are electrically polarized for metal deposition by feeding thereto at least one first and second forward-reverse pulse current sequences. The first forward-reverse pulse current sequence includes a first forward pulse generating a first cathodic current during a first forward pulse duration $t_{f1}$ and having a first forward pulse peak current $i_{f1}$, and a first reverse pulse generating a first anodic current during a first reverse pulse duration $t_{r1}$ and having a first reverse pulse peak current $i_{r1}$, the second forward-reverse pulse current sequence including a second forward pulse generating a second cathodic current during a second forward pulse
(Continued)

duration $t_{f2}$ and having a second forward pulse peak current $i_{f2}$, and a second reverse pulse generating a second anodic current during a second reverse pulse duration $t_{r2}$, the second reverse pulse having a second reverse pulse peak current $i_{r2}$.

17 Claims, 9 Drawing Sheets

(51) Int. Cl.
    *C25D 21/12*     (2006.01)
    *H05K 3/40*     (2006.01)
    *C25D 7/12*     (2006.01)

(52) U.S. Cl.
    CPC ..... *C25D 7/123* (2013.01); *H05K 2203/0723* (2013.01)

(56) References Cited

U.S. PATENT DOCUMENTS

| | | |
|---|---|---|
| 6,524,461 B2 | 2/2003 | Taylor et al. |
| 2002/0074234 A1 | 6/2002 | Dubin et al. |
| 2006/0151328 A1 | 7/2006 | Reents et al. |
| 2009/0236230 A1* | 9/2009 | Reents .................. H05K 3/423 205/103 |
| 2012/0160696 A1 | 6/2012 | Araki et al. |

* cited by examiner

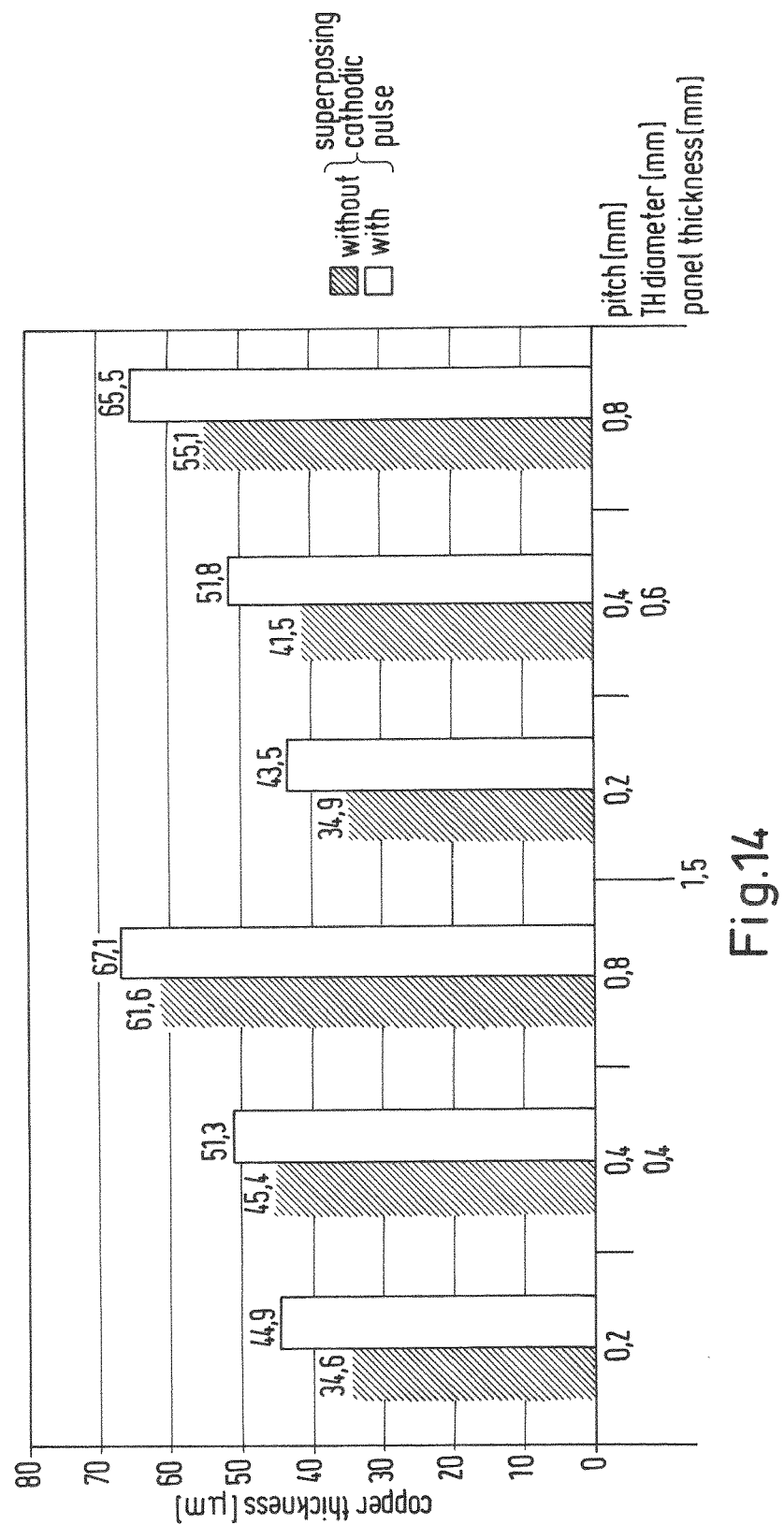

METHOD AND APPARATUS FOR ELECTROPLATING A METAL ONTO A SUBSTRATE

BACKGROUND OF THE INVENTION

1. Field of the Invention

The present invention relates to a method and to an apparatus for electroplating a metal, copper for example, onto a substrate. Such method and apparatus may be utilized in the field of electroplating an article to be used as an electrical device, such as a printed circuit board, a chip carrier, including a multichip carrier, or any other carrier having a circuitry thereon.

2. Brief Description of the Related Art

The manufacture of such electrical devices is well-known. The processes for their manufacture comprise a plurality of steps including the metal deposition step for producing the circuitry thereon. These process steps require metallization on the outer surface of the device as well as in the holes or other recesses in the electrical device. For example, printed circuit boards having a plurality of circuitry layers and also having a plurality of holes, namely through holes and blind holes, are to be electroplated with copper in order to generate a copper deposit, the thickness thereof being required to be as uniform as possible. Furthermore, copper deposition in the holes shall also be uniform. Especially, copper deposition is to be consistent both on the outer sides of the electrical device and in its holes to avoid that the holes are not provided with a sufficient copper thickness while coppering on the outer sides has already attained the required deposit thickness.

Pulse plating has mainly proved to be suitable to meet the above objectives. More specifically, reverse pulse plating has been identified to be particularly appropriate. Reverse pulse plating refers to a process comprising applying cathodic and anodic current pulses alternately to the electrical device.

U.S. Pat. No. 6,524,461 B2 for example teaches a method for depositing a continuous layer of a metal onto a substrate having small recesses in its surface. This method comprises applying a modulated reversing electric current comprising pulses that are cathodic with respect to said substrate and pulses that are anodic with respect to said substrate, wherein the on-time of said cathodic pulses is from about 0.83 μs to about 50 ms and the on-time of said anodic pulses is greater than the on-time of said cathodic pulses and ranges from about 42 μs to about 99 ms. In a typical example of the modulated reversing electric current sequence a waveform is used which comprises a cathodic (forward) pulse followed by an anodic (reverse) pulse. An off-period of relaxation period may follow either or both of the cathodic and anodic pulses.

Further, US 2006/0151328 A1 teaches a method of applying a pulse reverse current flow to work pieces having high-aspect ratio holes, i.e., holes whose length is large as compared to the diameter thereof. Holes having an aspect ratio of up to 10:1 and a hole length of 3 mm or even larger shall be processed efficiently. The pulse plating sequence to be applied to the work pieces is taught to comprise cathodic and anodic pulses and is used at a frequency of at most about 6 Hertz. Durations of the forward current pulses and reverse current pulses are indicated to be at least 100 ms (forward) or at least 0.5 ms (reverse), respectively. The peak current density of the forward current pulses is furthermore indicated to be at least 3 A/dm$^2$ and at most 15 A/dm$^2$ and that of the reverse current pulses to be at least 10 A/dm$^2$ and at most 60 A/dm$^2$. In a preferred embodiment of the process described in this document the work pieces are plate-shaped, such as printed circuit boards or any other plate-shaped electrical circuit carriers. In this preferred embodiment, the method comprises (a) applying a voltage to between a first side of the work piece and at least one first anode, to the effect that a first pulse reverse current flow is provided to the first side of the work piece, wherein said first pulse reverse current flow has at least one first forward current pulse and at least one first reverse current pulse flowing in each cycle time, and (b) applying a second voltage to between a second side of the work piece and at least one second anode, to the effect that a second pulse reverse current flow is provided to the second side of the work piece, wherein said second pulse reverse current flow has at least one second forward current pulse and at least one second reverse current pulse flowing in each cycle time. In a particularly preferred embodiment the first forward and reverse current pulses of one cycle are offset relative to the second forward and reverse current pulses of one cycle, respectively. This offset may advantageously be approximately 180°. It is furthermore indicated that, for further improving throwing power, the current flow may comprise, in each cycle time, one forward current pulse followed by one reverse current pulse and after that one zero current break.

It has proved that the above method is particularly useful in achieving good throwing power of copper deposition, i.e., uniform copper layer formation on the outer side of the work piece and on the walls of holes contained therein.

Such objective is however, not achievable with the plating conditions described, if the substrate to be plated is provided both with regions where there are many holes per unit area on the one hand and with regions where there are no or only a few holes per unit area on the other hand. Using the method described in US 2006/0151328 A1 will not consistently metalize these regions: In those regions, where no or only a few holes are provided, copper thickness will be large as compared to those regions which have many holes per unit area.

Furthermore, it has proved disadvantageous that this known method of hole wall plating leads to differing coppering results in the holes in different regions of a board.

It has proved necessary that through holes are first X-(bridge-) plated, i.e., deposition shall lead to enhanced copper deposition in the middle of the hole thereby closing it by forming a copper plug there, thus forming two blind holes each one being accessible from one of the sides of the board. Then the two hole parts are completely filled which means that the total volume of the hole is filled with metal. When a known method is used to perform this procedure, holes being located in the border area of the board will not be plated as efficiently as holes being located in the middle thereof. Consequently, the border holes will not be closed in their center region when the middle holes are filled already. This leads to an undesirable situation wherein hole-filling is varying in the different regions of the board.

Furthermore, conformal plating of through holes and blind holes, i.e., plating of a thin layer of copper on the walls of the holes without filling these, is not uniform when the method of US 2006/0151328 A1 is used.

SUMMARY OF THE INVENTION

Therefore, a first object of the present invention is to provide a method for electroplating a metal onto a flat substrate, which method provides for uniform metal electroplating on work pieces or other substrates, more particularly on plate-shaped substrates, such as boards, foils, and the like. More specifically, the method of the invention shall be suitable to uniformly electroplate a substrate having both at least one outer side and holes, i.e., through holes, blind holes, or holes having any other shape, on all surface regions of these outer sides and inside the holes, i.e., exhibiting a deposit thickness which is as uniform as possible and which does not or only to a minor extent depend on the location on the substrate surface. Still more specifically, the method of the invention shall be suitable to deposit metal on the outer sides of the board as uniformly as possible irrespective of whether metal is plated in an area where holes are located or in an area where no holes are located. Even more specifically, the method of the invention shall be suitable to deposit metal in the holes either to uniformly deposit a metal layer on the hole walls (conformal plating) or to uniformly generate a metal plug inside the holes (X- (bridge-) plating) and subsequently fill the holes with metal. In this latter case, the method of the invention shall be suitable to fill the holes uniformly irrespective of whether the holes are located near an edge of the board or in the center of the board. Even more specifically, the method of the invention shall be suitable to deposit metal to boards having two sides, either on one side only or on both sides, wherein either conformal plating or hole filling is performed.

A second object of the present invention is to provide an apparatus which is suitable to perform the method for electroplating the metal onto the substrate according to the invention. The construction, installation, maintenance, and operation of such apparatus shall be as easy as possible.

The present invention is suitable to achieve the above objects.

The method of the invention comprises the following method steps and may comprise further method steps:
(a) providing:
  i. the flat substrate, which has two opposing first and second substrate surfaces,
  ii. an electroplating apparatus, which comprises at least one counter electrode (anode); and
  iii. an electroplating liquid;
(b) bringing each of the flat substrate with said opposing first and second substrate surfaces and the at least one counter electrode into contact with the electroplating liquid; and
(c) electrically polarizing said first and second substrate surfaces of the substrate to effect metal deposition onto the first and second substrate surfaces by feeding at least one first forward-reverse pulse current sequence each one being composed of successive first forward-reverse pulse periods to the first substrate surface and at least one second forward-reverse pulse current sequence each one being composed of successive second forward-reverse pulse periods to the second substrate surface; the first and second forward-reverse pulse current sequences are applied to the respective substrate surfaces simultaneously;
(d) each one of said at least one first forward-reverse pulse current sequence at least comprising, in each one of consecutive first forward-reverse pulse periods, a first forward pulse generating a first cathodic current during a first forward pulse duration $t_{f1}$ at the first substrate surface, said first forward pulse having a first forward pulse peak current $t_{f1}$, and a first reverse pulse generating a first anodic current during a first reverse pulse duration $t_{r1}$ at the first substrate surface, said first reverse pulse having a first reverse pulse peak current $i_{r1}$; and each one of said at least one second forward-reverse pulse current sequence at least comprising, in each one of consecutive second forward-reverse pulse periods, a second forward pulse generating a second cathodic current during a second forward pulse duration $t_{f2}$ at the second substrate surface, said second forward pulse having a second forward pulse peak current $i_{f2}$, and a second reverse pulse generating a second anodic current during a second reverse pulse duration $t_{r2}$ at the second substrate surface, said second reverse pulse having a second reverse pulse peak current $i_{r2}$;
the first and second forward and reverse pulse peak currents are to be understood herein both, as the currents irrespective of the surface area of the first and second substrate surfaces to which these first and second pulse currents are applied, and wherein a current density is the current being applied to a predetermined unit area on the substrate surfaces;
(e) wherein said first and second forward pulses are each further superposed with a respective first or second superposing cathodic pulse, preferably with one, or alternatively more than one, superposing cathodic pulse (s), said first and second superposing cathodic pulse(s) having a respective first or second superposing cathodic pulse duration $t_{c1}$, $t_{c2}$ which is shorter than the respective first or second forward pulse duration $t_{f1}$, $t_{f2}$; and wherein a phase shift $\varphi_r$ between said first reverse pulse of said at least one first forward-reverse current sequence and said second superposing cathodic pulse of said at least one second forward-reverse current sequence is set to 0°±30°.

The apparatus of the invention comprises the following items and may comprise further items:
(a) means for holding the substrate, wherein the substrate has opposing first and second substrate surfaces;
(b) at least one counter electrode (anode);
(c) means for accommodating an electroplating liquid;
(d) means for electrically polarizing the substrate to effect metal deposition onto the first and second substrate surfaces;
wherein said means for electrically polarizing the first and second substrate surfaces is designed to feed at least one first forward-reverse pulse current sequence, each one being composed of successive first forward-reverse pulse periods, to the first substrate surface and at least one second forward-reverse pulse current sequence each one being composed of successive second forward-reverse pulse periods to the second substrate surface;
wherein each one of said at least one first forward-reverse pulse current sequence at least comprises, in each one of consecutive first forward-reverse pulse periods, a first forward pulse generating a first cathodic current during a first forward pulse duration $t_{f1}$ (pulse width) at the first substrate surface, said first forward pulse having a first forward pulse peak current $i_{f1}$, and a first reverse pulse generating a first anodic current during a first reverse pulse duration $t_{r1}$ (pulse width) at the first substrate surface, said first reverse pulse having a first reverse pulse peak current $i_{r1}$; and
each one of said at least one second forward-reverse pulse current sequence at least comprises, in each one of consecutive second forward-reverse pulse periods, a second forward pulse generating a second cathodic current during a second forward pulse duration $t_{f2}$ at the second substrate surface, said second forward pulse having a second forward pulse peak current $i_{f2}$, and a second reverse pulse generating a second anodic current during a second reverse pulse duration $t_{r2}$ at the second substrate surface, said second reverse pulse having a second reverse pulse peak current $i_{r2}$; and wherein said first and second forward pulses are further superposed with a respective first or second superposing cathodic pulse, preferably with one, or alternatively more than one, superposing cathodic pulse(s), said first and second superposing cathodic pulse(s) having a respective first or second superposing cathodic pulse duration $t_{c1}$, $t_{c2}$ which is shorter than the respective first or second forward pulse duration $t_{f1}$, $t_{f2}$; and
wherein said means for electrically polarizing the first and second substrate surfaces is further designed to provide a phase shift $\varphi_r$ between said first reverse pulse of said at least one first forward-reverse current sequence and said second superposing cathodic pulse of said at least one second forward-reverse current sequence is set to 0°±30°.

As far as a phase shift between two pulses, for example $\varphi_r$, is mentioned in this description and the claims, it refers to the difference in starting times of the pulses, expressed as an angle being the fraction of a full cycle of 360°.

By using the method and apparatus of the invention, it has proved that uniform metal plating is achieved on flat substrates. More specifically, especially with copper electroplating, on plate-shaped substrates, such as boards and foils, metal deposition on the outer sides of the substrates (on both sides thereof) is made more uniform even if the substrates are provided with first regions which exhibit many holes per unit area and with second regions which exhibit no or only a few holes per unit area. Metal deposition on the outer sides of the substrates in both regions is made consistent with the method of the invention. The apparatus of the invention is suitable in performing this method.

For performing the method of the invention the substrate is electrically polarized to effect metal deposition onto the first and second opposing substrate surfaces. To this end, cathodic current pulses and anodic current pulses are generated. Generating these pulses is performed by applying a voltage across the at least one counter electrode and the substrate which are located adjacent to each other. The voltage is likewise created as voltage pulses, i.e., cathodic (forward) voltage pulses to generate cathodic (forward) current pulses and anodic (reverse) voltage pulses to generate anodic (reverse) current pulses. Those skilled in the art will recognize that the voltage and current therefore will have an interdependency in that they may be proportional to each other under the conditions of the method of the invention or at least a monotonic dependency such that the current rises if the voltage is increased and vice versa. The terms 'cathodic' and 'anodic' are used to denote the type of polarization of the substrate: A cathodic (forward) current pulse is of the type of depositing metal on the substrate, while an anodic (reverse) current pulse is of the type of re-dissolving metal from the substrate. To accomplish an overall metal deposition on the substrate, it will be necessary to shape the cathodic and anodic current pulses such that more metal is deposited than metal is re-dissolved. This will in general be achieved by setting the forward pulse duration $t_f$ longer than the reverse pulse duration $t_r$. It is anyway required that the integral of the forward current pulse (peak current over time) is greater than the integral of the reverse current pulse (peak current over time). As the reverse pulse peak current $i_r$ is very often higher than the forward pulse peak current $i_f$, the forward pulse duration $t_f$ must be further extended to accomplish a net (overall) metal deposition.

In general, a rectifier is used to polarize the substrate. The rectifier applies the pulsed negative or positive potential to the substrate to bring about the respective current pulses.

The rectifier on its part may be controlled by a suitable pulse generator to produce the pulses at the rectifier. Furthermore, voltage and current pulses may be generated with any other well-known means to feed a substrate to be electroplated with current pulses.

In principle, the forward pulses, reverse pulses, and superposing cathodic pulses may have any pulse shape. But, a rectangular pulse shape for any one or any plurality of or all of the forward pulses, reverse pulses, and superposing cathodic pulses is preferred. In this respect, it has to be considered that the pulse shapes of the pulses may be distorted due to a limited pulse raising rate and pulse decaying rate so that, in principle, a trapezoidal pulse shape (which may, by approximation, be nearly a rectangular pulse shape) for any one of these pulses may preferably be applicable.

The above principle is also applicable for superposing said first and second forward pulses with the respective first and second superposing cathodic pulses according to the present invention. Superposition will be achieved by an appropriate control of the voltage/current supply (rectifier), preferably the current supply, thereby generating the respective pulse shape.

Superposition is performed such that the superposing cathodic pulse is shorter than the forward current pulse of the same forward-reverse pulse current sequence. Under this condition, the superposing cathodic pulse can be located at any time interval during the cathodic current pulse. Consequently, the superposing cathodic pulse may be set to occur at the start time of the cathodic current pulse, at its time center, or at its end or at any other point of time during the cathodic current pulse, i.e., it may be set independently with respect to the start time of the cathodic current pulse and with respect to the start time of the reverse current pulse which means that $\xi_c$ (angular offset between the reverse pulse and the superposing cathodic pulse within the same forward-reverse pulse current sequence) may be set at any value from 0° to 360°. In a preferred embodiment of the present invention, the superposing cathodic pulse is displaced by 180° relative to the reverse pulse, i.e., the start time of the superposing cathodic pulse is delayed with reference to the start time of the reverse pulse by 180° ($\xi_c$, considering that a complete cycle of the forward-reverse pulse current sequence covers 360°). The superposing cathodic pulse appears as a temporarily raised cathodic current during the cathodic current pulse. The term 'superposing' is not to be understood to denote that two currents are to be superposed to achieve the respective current waveform. The increase of the current by the superposing cathodic peak current $i_c$ during the superposing cathodic pulse duration may be achieved in any manner. The forward pulse peak current $i_f$ and the superposing cathodic pulse peak current $i_c$ add to an overall cathodic peak current $i_{c+f}$. $i_c$ may be set independently from $i_f$ (forward pulse peak current) and $i_r$ (reverse pulse peak current) in the same forward-reverse pulse current sequence or in different forward-reverse pulse current sequences. Likewise, $i_f$ may be set independently from $i_c$ and $i_r$, and vice versa.

The apparatus of the invention comprises means for holding the substrate. The means for holding the substrate may be any holder like a frame which is in turn held by a flight bar for example or may be rollers transporting the substrate through a conveyorized apparatus. The means for holding the substrate may furthermore be suitable for contacting the substrate with the electroplating liquid as they cause the substrate to be immersed into a tank for example which contains the electroplating liquid. If the substrate is electroplated in a so-called vertical system, i.e., in a plant comprising tanks or containers for holding the electroplating liquid into which the substrate is immersed for being electroplated, this holding means may be a frame. The frame may be held at the tank or container. If the substrate is treated in a so-called horizontal system, i.e., in a conveyorized plant wherein the substrate is conveyed in a horizontal direction while being electroplated, the holding means may be conveyorized clamps or rollers or other moving elements clamping or otherwise seizing the substrate.

The apparatus of the invention furthermore comprises means for accommodating the electroplating liquid. This accommodating means may be a tank or container or any other means which is suitable for storing the liquid.

The apparatus of the invention furthermore comprises means for bringing each of the substrate and the at least one counter electrode into contact with the electroplating liquid. If the substrate is treated in a vertical system, the substrate contacting means may be a transport carriage which transports the substrate from one tank or container to another one and lowers and immerses the substrate into the electroplating liquid in the tank or container of concern. If the substrate is treated in a horizontal system, this contacting means may be an electroplating liquid delivering means, such as nozzles, or the conveying means which transports the substrate from one conveyorized module of the system to another one if the substrate is immersed by this transport means into the electroplating liquid in the module of concern. The counter electrode contacting means may be a container of the vertical or horizontal system holding the electroplating liquid wherein the counter electrode is immersed into.

The apparatus of the invention furthermore comprises at least one counter electrode, which is required to cause an electrochemical reaction to occur at the substrate. The at least one counter electrode is preferably located in the vicinity of the substrate and is, together with the substrate, brought into contact with the electroplating liquid, to cause an electrical current flow between the substrate and the at least one counter electrode. In a horizontal conveyorized system a plurality of counter electrodes may be placed in succession along the conveyor path for the substrate, either on one side of the conveyor path or on both sides of the conveyor path.

The apparatus furthermore comprises a means for electrically polarizing the substrate to effect metal deposition onto the first and second substrate surfaces. This polarizing means serves for feeding electrical energy to the substrate. For this purpose it may be a current/voltage source/supply, such as a rectifier. The polarizing means is electrically connected to the substrate and the at least one counter electrode.

The polarizing means is furthermore designed to feed the at least one first and second forward-reverse pulse current sequences to the at least one substrate surface. For this purpose the polarizing means is electrically connected to the substrate surfaces individually and may be equipped with a control means which provides for the generation of the forward-reverse pulse current sequences. Such control means may be an electrical circuit arrangement which may be driven by a microcontroller which in turn may be programmed by a computer.

The substrate is a flat substrate having opposing first and second substrate surfaces. The first and second substrate surfaces are each electrically polarized to effect metal deposition thereon, preferably independently from one another. This is achieved by feeding the at least one first forward-reverse pulse current sequence, each one being composed of successive first forward-reverse pulse periods, each one of said first forward-reverse pulse current sequences having, in each first forward-reverse pulse period, the first forward pulse, the first reverse pulse, and the first superposing cathodic pulse, to the first substrate surface, and the at least one second forward-reverse pulse current sequence, each one being composed of successive second forward-reverse pulse periods, each one of said second forward-reverse pulse current sequences having, in each second forward-reverse pulse period, the second forward pulse, the second reverse pulse, and the second superposing cathodic pulse, to the second substrate surface. The at least one first forward-reverse pulse current sequence and the at least one second forward-reverse pulse current sequence are applied simultaneously to the substrate surfaces. The two pulse current sequences preferably have the same frequency and same pulse train, i.e., same consecutions of pulses. Even more preferably, the at least one first and second forward-reverse pulse current sequences may be offset to each other by a phase shift $\varphi_s$ of about 180° (±30°) or of exactly 180° (i.e., the phase shift between first and second forward-reverse pulse current sequences being defined as the shift between the start times of the reverse pulses of the first and second pulse current sequences, respectively, wherein a complete cycle (first or second forward-reverse pulse period) covers 360°). A phase shift $\varphi_s$ being exactly 180° means that the start time of the first superposing cathodic pulse on one side of the substrate is at the same time as the start time of the second reverse pulse on the other side of the substrate, if the superposing cathodic pulse and the reverse pulse within the same (first or second) forward-reverse pulse current sequence are offset relative to each other by $\xi_c=180°$ ($\xi_c$: angular offset between the start time of the reverse pulse and the start time of the superposing cathodic pulse within the same forward-reverse pulse current sequence). Or the phase shift $\varphi_s$ may be substantially lower than 180° such as $\varphi_s=5°$ or 10° or 15° or 20° or 45° or 90° or 135° or it may have any other value, for example 180°±30°, more preferably 180°±20° and most preferably 180°±10°. This variation may apply both to conformal plating and X-(bridge-) plating.

The phase shift $\varphi_s$ being greater than 0° enables enhancing uniformity of X- (bridge-) plating in through holes, with a 180° phase shift $\varphi_s$ offering maximum plating in the through holes, i.e., by phasing the first and second forward-reverse pulse current sequences being applied to the opposing sides of the flat substrate such that the superposing cathodic pulse of one of these sequences occurs at the same time as the reverse pulse of the other one of these sequences.

The phase shift $\varphi_s$ being greater than 0° also enhances uniformity of the thickness of plated metal on the outer surface of the substrate irrespective of whether the metal is plated in a region where the substrate has holes or in a region where the substrate has no or only a few holes.

When conformal plating is applied to a flat substrate having opposing first and second substrate surfaces and holes (blind holes and/or through holes), a thin layer of copper is plated onto the substrate surface and on the walls of the holes (in case of blind holes also on the bottom of the holes) without filling these. The phase shift $\varphi_s$ being greater than 0° as described above also enhances uniformity of the thickness of plated metal on the surface of the substrate during conformal plating. By applying the superposing cathodic pulse it might happen that too much metal is plated into the holes, such that the metal layers plated onto the walls of the holes are too thick. In this case it is also of advantage to change the phase shift $\varphi_s$ to lie within a range of from 180°±20°, more preferably in a range of from 180°±10°. By applying a phase shift $\varphi_s$ differing from 180°, uniformity of the thickness of plated metal on the outer surface of the substrate is still enhanced while the thickness of the metal layers plated onto the walls of holes is slightly decreased and thus is kept within the desired thickness range. The same effect is achieved if the angular offset $\xi_c$ differs from 180°, preferably when $\xi_c$ lies within a range of from 180°±20°, more preferably in a range of from 180°±10°, or as the phase shift $\varphi_r$ differs from 0°, namely as $\varphi_r$ lies within a range of from 0°±30°, preferably within a range of from 0°±20°, even more preferably within a range of from 0°±10°.

Furthermore, it is preferred that the durations $t_{r1}$, $t_{r2}$ of the first and second reverse pulses are about the same (±50% relative to the first reverse pulse duration $t_{r1}$) or are exactly the same.

Accordingly, to define the chronology of the at least one first and second forward-reverse pulse current sequences relative to each other, the following parameters and preferred embodiments are to be considered:

The phase shift $\varphi_s$ between the first and the second pulse current sequences is defined as the shifting of the start times of the reverse pulses of the two pulse current sequences relative to each other. This parameter is set to be 180° preferably.

The phase shift between the reverse pulse of the first forward-reverse pulse current sequence and the superposing cathodic pulse of the second forward-reverse pulse current sequence, applied simultaneously, is denoted by $\varphi_r$. This parameter is preferably set to be 0°±30°, 0°±20°, 0°±10°, more preferably about 0°, even more preferably exactly 0°. This parameter is preferably set to be 0°±Δ$\varphi_r$, wherein Δ$\varphi_r$ is 30°, preferably is 20°, more preferably is 10°, and wherein $\varphi_r$ even more preferably is about 0° and most preferably is exactly 0°.

The angular offset between the reverse pulse and the superposing cathodic pulse within the same (first or second) forward-reverse pulse current sequence is denoted by $\xi_c$. This parameter is preferably set to be about 180° (±30%) or exactly 180°.

Such further embodiment enhances electroplating in the through holes and enables hole filling. If through holes connecting the first and second sides are provided, formation of a metal layer on the through hole walls is made very uniform even if the aspect ratio of the through holes is high. X- (bridge-) plating is equally well performed to yield excellent results because metal electroplating is forced to occur in the holes. Especially differences in closing the through holes in their center areas in various regions of the substrate do not occur.

In a further preferred embodiment of the present invention, in each pulse current sequence, the durations/widths $t_r$ of the first and second reverse pulses equal the respective durations/widths $t_c$ of the first and second superposing cathodic pulses on the respective other side of the flat substrate, i.e., the duration/width $t_{r1}$ of the first reverse pulse preferably equals the duration/width $t_{c2}$ of the second superposing cathodic pulse, and the duration/width $t_{r2}$ of the second reverse pulse preferably equals the duration/width $t_{c1}$ of the first superposing cathodic pulse. More preferably, all durations/widths of the first reverse pulse $t_{r1}$, the first superposing cathodic pulse $t_{c1}$, the second reverse pulse $t_{r2}$, and the second superposing cathodic pulse $t_{c2}$ are at least approximately the same (±20% relative to the duration/width $t_{r1}$, $t_{r2}$ of the reverse pulse).

These further preferred embodiments make uniform electroplating on the hole walls possible, irrespective of the location of the holes on the substrate, i.e., irrespective of whether the holes are located in the vicinity of the border of the substrate or in a center region of the substrate.

In a further preferred embodiment of the present invention, said first reverse pulse and said second superposing cathodic pulse are applied simultaneously and said second reverse pulse and said first superposing cathodic pulse are applied simultaneously.

In a further preferred embodiment of the present invention, none of the at least one first and second forward-reverse pulse current sequences, either in one of said first and second method section periods only or in both method section periods, comprises any forward-reverse pulse period wherein the current is set to zero (pulse break). For this embodiment, the at least one forward-reverse pulse current sequence has proved to yield an improved result as to uniformity of metal deposition in the hole filling process. Contrary to previous results using the method of US 2006/0151328 A1 for metal deposition on the hole walls, a pulse break having zero current has been discovered not to be advantageous for X- (bridge-) plating and hole filling. Instead of this achievement, setting the first and second superposing cathodic pulses simultaneously or at least nearly simultaneously with the reverse pulse at the respective opposing side of the substrate and preferably also for the same duration as the respective reverse pulses, i.e., the first superposing cathodic pulse simultaneously or nearly simultaneously with the second reverse pulse and the second superposing cathodic pulse simultaneously or nearly simultaneously with the first reverse pulse, has proved advantageous over setting pulse breaks simultaneously with the respective reverse pulses.

It has also been found advantageous to fill holes using a pulse current sequence wherein no superposing cathodic pulses are used. Preferably, in this case, no zero current pulses are used either. It may in such cases also be advantageous to use first and second forward-reverse pulse current sequences wherein the phase shift $\varphi_s$ between the first and second reverse pulses thereof is greater than 0° and preferably nearly or exactly 180°.

In a further preferred embodiment of the present invention, the method further comprises, subsequent to performing the first and second forward-reverse pulse current sequences to the first and second substrate surfaces in accordance with method steps (d) and (e) in a first method section period, applying, in a second method section period, at least one further first and second forward-reverse pulse current sequences each one thereof comprising a plurality of consecutive respective first or second forward-reverse pulse periods, wherein each one of the consecutive respective first or second forward-reverse pulse periods comprises a respective first or second forward pulse generating a cathodic current during a respective first or second forward pulse duration $t_{f1}$, $t_{f2}$ at the respective first or second substrate surface, said respective first or second forward pulse having a respective first or second forward pulse peak current $i_{f1}$, $i_{f2}$, and a respective first or second reverse pulse generating a respective first or second anodic current during a respective first or second reverse pulse duration $t_{r1}$, $t_{r2}$ at the respective first or second substrate surface, said first and second reverse pulses having a respective first or second reverse pulse peak current $i_{r1}$, $i_{r2}$, without superposing the respective first or second forward pulses with a respective first or second superposing cathodic pulse.

In the first method section period, on a first side of the flat substrate, a first forward-reverse pulse current sequence is applied and on a second side of the flat substrate, a second forward-reverse pulse current sequence is applied. The first and second forward-reverse pulse current sequences comprise, in this first method section period, first or second forward pulses, respectively, first or second reverse pulses, respectively, and first or second superposing cathodic pulses, respectively. Furthermore, in the second method section period, on a first side of the substrate a first further forward-reverse pulse current sequence is applied and on a second side of the substrate, a second further forward-reverse pulse current sequence is applied. The first and second further forward-reverse pulse current sequences in this second method section period comprise first or second forward pulses, respectively, and first or second reverse pulses, respectively, but no first or second superposing cathodic pulses, respectively. In the second method section period the first and second forward-reverse pulse current sequences may be offset to each other by a phase shift $\varphi_s$ of 180° or less than 180°, as defined above for the first and second forward-reverse pulse current sequences comprising superposing cathodic pulses.

This further preferred embodiment serves for filling through holes in a substrate after a plug has been formed in the holes by using an X- (bridge-) plating technique. The first method section period serves to create a plug in the center of the through hole by electrodepositing the metal in the center until metal has built up to plug the hole diameter. Thus, two hole sections are created, one being open to one side of the substrate and the other one being open to the other side of the substrate. The two hole sections each form a blind hole. In the second method section period these two hole sections are filled from the bottom of the respective blind hole to the respective outer side of the substrate.

The individual processing conditions indicated as follows will be applicable to each one of the following pulse current sequence conditions (if applicable):
  electroplating of each one of both substrate surfaces; or
  in the case of applying both, one single or two forward-reverse pulse current sequence(s), to X- (bridge-) plating for through hole filling.

As described herein, any pulse that is indicated to be a forward pulse exerts a cathodic current to the substrate, and any pulse that is indicated to be a reverse pulse exerts an anodic current to the substrate.

In a further preferred embodiment of the present invention, the forward pulse duration $t_f$ (first and/or second forward pulse duration) is at least 5 ms, more preferably at least 20 ms, and most preferably at least 70 ms. The forward pulse duration is preferably at most 250 ms, more preferably at most 150 ms, and most preferably at most 80 ms.

The start time $t_{sf}$ of the forward pulse (first and/or second forward pulse) may be at any time during the cycle time $T_p$ of the pulse period of the forward-reverse pulse current sequence.

In a further preferred embodiment of the present invention, the reverse pulse duration $t_r$ (first and/or second reverse pulse duration) is at least 0.1 ms, more preferably at least 0.2 ms, and most preferably at least 1 ms. The reverse pulse duration $t_r$ is preferably at most 100 ms, more preferably at most 50 ms, and most preferably at most 6 ms.

The start time of the reverse pulse (first and/or second reverse pulse) may be at any time during the cycle time $T_p$ of the pulse period of the forward-reverse pulse current sequence.

In a further preferred embodiment of the present invention, the superposing cathodic pulse duration $t_c$ (first and/or second superposing cathodic pulse duration) is at least 0.1 ms, more preferably at least 0.2 ms, and most preferably at least 1 ms. The superposing cathodic pulse duration $t_c$ is preferably at most 100 ms, more preferably at most 50 ms, and most preferably at most 6 ms.

The start time $t_{sc}$ of the superposing cathodic pulse (first and/or second superposing cathodic pulse) may be at any time during the forward pulse.

In a further preferred embodiment of the present invention, the angular offset $\xi_c$ between the reverse pulse and the superposing cathodic pulse of a forward-reverse pulse current sequence may be any value of from 0° to 180°. It is preferably about 180° or exactly 180°.

In a further preferred embodiment of the present invention, the forward pulse peak current $i_f$ [A] (first and/or second forward pulse peak current), expressed as a forward pulse peak current density $I_f$ [A/dm$^2$], referring to the surface area of the substrate to be plated, is at least 0.1 A/dm$^2$, more preferably at least 0.2 A/dm$^2$, and most preferably at least 0.5 A/dm$^2$. The forward pulse peak current density $I_f$ [A/dm$^2$] is preferably at most 50 A/dm$^2$, more preferably at most 25 A/dm$^2$, and most preferably at most 15 A/dm$^2$.

In a further preferred embodiment of the present invention, the reverse pulse peak current $i_r$ [A] (first and/or second reverse pulse peak current), expressed as a reverse pulse peak current density $I_r$ [A/dm$^2$], referring to the surface area of the substrate to be plated, is at least 0.2 A/dm$^2$, more preferably at least 0.5 A/dm$^2$, and most preferably at least 1.0 A/dm$^2$. The reverse pulse peak current density $I_r$ is preferably at most 120 A/dm$^2$, more preferably at most 80 A/dm$^2$, and most preferably at most 40 A/dm$^2$.

The superposing cathodic pulse peak current $i_c$ [A] (first and/or second superposing cathodic pulse peak current), expressed as a superposing cathodic pulse peak current density $I_c$ [A/dm$^2$], referring to the surface area of the substrate to be plated, adds to the forward pulse peak current density $I_f$ during the superposing cathodic pulse duration $t_c$, so that the peak current (density) during the period of applying the superposing cathodic pulse is the sum of the forward pulse and superposing cathodic pulse peak currents (current densities). In a further preferred embodiment of the present invention, the overall cathodic peak current density $I_{c+f}$ (or overall peak current $i_{c+f}$) comprising the forward pulse peak current density $I_f$ plus the superposing cathodic pulse peak current density $I_c$ (or the forward pulse peak current $i_f$ plus the superposing cathodic pulse peak current $i_c$, respectively) is at least 0.2 A/dm$^2$, more preferably at least 0.5 A/dm$^2$, and most preferably at least 1.0 A/dm$^2$. The overall cathodic pulse peak current density $I_{c+f}$ is preferably at most 120 A/dm$^2$, more preferably at most 80 A/dm$^2$, and most preferably at most 40 A/dm$^2$.

In a further preferred embodiment of the present invention, the ratio of the forward pulse duration $t_f$ (first or second forward pulse duration) to the reverse pulse duration $t_r$ (first or second reverse pulse duration, respectively) of the same forward-reverse pulse current sequence is at least 1. The ratio of the forward pulse duration $t_f$ to the reverse pulse duration is preferably at most 20 and more preferably at most 5.

In a further preferred embodiment of the present invention, the ratio of the forward pulse peak current density $I_f$ (first or second forward pulse peak current density) to the reverse pulse peak current density $I_r$ (first or second reverse pulse peak current density, respectively) of the same forward-reverse pulse current sequence is at least 0.0125, more preferably at least 0.05, and most preferably at least 0.125. The ratio of the forward pulse peak current density $I_f$ to the reverse pulse peak current density $I_r$ is preferably at most 10, more preferably at most 1, and most preferably at most 0.5.

In a further preferred embodiment of the present invention, a third pulse is comprised by the at least one first and/or second forward-reverse pulse current sequence. This third pulse may be a forward (cathodic) or reverse (anodic) pulse. The third pulse duration $t_a$ is preferably at least 0.1 ms, more preferably at least 0.5 ms, and most preferably at least 1 ms. The third pulse duration $t_a$ is preferably at most 100 ms, more preferably at most 50 ms, and most preferably at most 10 ms.

In a preferred embodiment of the present invention, the angular offset $\xi_a$ between the reverse pulse and the third pulse may be any value of from 0° to 180°.

The start time $t_{sa}$ of the third pulse may be at any time during the cycle time $T_p$ of the pulse period of the forward-reverse pulse current sequence.

In a further preferred embodiment of the present invention, the third pulse peak current $i_a$ [A], expressed as a third pulse peak current density $I_a$ [A/dm$^2$], referring to the surface area of the substrate to be plated, is at least 0.2 A/dm$^2$, more preferably at least 0.5 A/dm$^2$, and most preferably at least 1.0 A/dm$^2$. The third pulse peak current density $I_a$ is preferably at most 120 A/dm$^2$, more preferably at most 80 A/dm$^2$, and most preferably at most 40 A/dm$^2$.

In a further preferred embodiment of the present invention, the at least one first and/or second forward-reverse pulse current sequence may (in each pulse period) also comprise a pulse break (first and/or second break) wherein the current is set to zero. The pulse break duration $t_b$ (first and/or second pulse break duration) is preferably at least 0.1 ms, more preferably at least 0.5 ms, and most preferably at least 1 ms. The pulse break duration $t_b$ is preferably at most 100 ms, more preferably at most 50 ms, and most preferably at most 10 ms.

In a preferred embodiment of the present invention, the angular offset $\xi_b$ between the reverse pulse and the pulse break may be any value of from 0° to 180°. It is preferably about 180° or exactly 180°. The start time $t_{sb}$ of the pulse break (first and/or second pulse break) may be at any time during the cycle time $T_p$ of the pulse period of the forward-reverse pulse current sequence.

Due to electrical constraints in real systems, the rise and decay of current or voltage changes do not occur instantaneously but need a certain time. For this reason, each current or voltage rise or decay is accompanied by a rising slope and a decay slope. This slope may have a slope duration $t_{sl}$ which is preferably as low as possible and may be at least 0.05 ms, more preferably at least 0.1 ms, and most preferably at least 0.2 ms. The slope duration $t_{sl}$ is preferably at most 5 ms, more preferably at most 2 ms, and most preferably at most 1 ms.

In a further preferred embodiment of the present invention, the frequency f of the repetition of the at least one first and/or second forward-reverse pulse periods is at least 0.5 Hz, more preferably at least 1 Hz, and most preferably at least 3 Hz. The frequency f of the repetition of the at least one forward-reverse pulse period is preferably at most 20 kHz, more preferably at most 10 kHz, and most preferably at most 5 kHz. The cycle time $T_p$ is the reciprocal of the frequency f.

In a further preferred embodiment of the present invention, the metal is copper. Such metal is preferably used to create the circuitry on electrical devices. In general, other metal like nickel, tin, lead, or alloys thereof may be electroplated with the method and apparatus of the invention.

In a further preferred embodiment of the present invention, the electroplating liquid contains, in addition to a solvent, water for example, ions of the at least one metal to be deposited as well as at least one component enhancing electrical conductivity of the liquid. The liquid may further contain at least one acid/base adjuster and/or at least one additive influencing the mechanical, electrical, and/or other properties of the metal deposit and/or influencing the thickness distribution of the metal deposit and/or influencing the plating performance of the electroplating liquid including its stability against decomposition like oxidation or the like. The ions of the at least one metal may be hydrated ions or complexed ions. The acid/base adjuster may simply be an acid or a base and/or be a buffer. The component enhancing the electrical conductivity of the liquid may be a metal salt or acid or base. The first and second additives may be brighteners, levelers, antioxidants, carriers, and the like.

If the electroplating liquid is a copper electroplating liquid, the solvent will be, in general, water. The ions of the at least one metal to be deposited may, in general, be divalent copper ions ($Cu^{2+}$) having respective counter ions like sulfate, methanesulfonate, or pyrophosphate or be bound as a complex. The component enhancing electrical conductivity of the liquid and the acid/base adjuster may be sulfuric acid or any other acid like methane sulfonic acid. The additive influencing the mechanical, electrical, and/or other properties of the metal deposit and/or influencing the thickness distribution of the metal deposit may be polyethylene glycol and/or an organic compound having sulfur in a low oxidation state like a disulfide compound. Furthermore, this liquid may contain sodium or potassium chloride.

In order to perform conformal plating in holes in a board and/or onto the outer surface of a board, a plating conformal composition is used which preferably comprises a copper salt, preferably copper sulfate, sulfuric acid, chloride ions, iron(II) and iron(III) ions to form a redox couple, preferably iron(II) and iron(III) sulfate, and plating additives. The concentration of the copper salt in the conformal plating composition is preferably in a range of from about 22 to about 40 g copper ions per liter. The optimum concentration thereof is preferably 25 g copper ions per liter. The concentration of sulfuric acid in the conformal plating composition is preferably in a range of from about 180 to about 240 g/l. The optimum concentration thereof is preferably 200 g/l. The concentration of the chloride ions in the conformal plating composition is preferably in a range of from about 80 to about 120 mg/l. The optimum concentration thereof is preferably 100 mg/l.

In order to perform X- (bridge-) plating in holes in a board, i.e., to create a plug inside the holes, and to fill the holes thereafter, an X- (bridge-) plating composition is used which preferably comprises a copper salt, preferably copper sulfate, sulfuric acid, chloride ions, iron(II) and iron(III) ions to form a redox couple, preferably iron(II) and iron(III) sulfate, and plating additives. The concentration of the copper salt in the X- (bridge-) plating composition is preferably in a range of from about 65 to about 80 g copper ions per liter. The optimum concentration thereof is preferably 75 g copper ions per liter. The concentration of sulfuric acid in the X- (bridge-) plating composition is preferably in a range of from about 60 to about 80 g/l. The optimum concentration thereof is preferably 70 g/l. The concentration of the chloride ions in the X- (bridge-) plating composition is preferably in a range of from about 80 to about 120 mg/l. The optimum concentration thereof is preferably 100 mg/l.

The concentration of the iron(II) ions in either of these plating compositions will preferably be at least 1 g/l and will more preferably be in a range of from about 2 to about 25 g/l. The concentration of the iron(III) ions in either of these plating compositions will preferably be in a range of from about 0.5 to about 30 g/l and will more preferably be in a range of from about 1 to about 9 g/l. In general, these concentrations may be set higher for conformal plating than for X-(bridge-) plating.

The plating additives may preferably be organic additives, which may be brighteners, levelers, wetting agents, and the like.

In general, sulfur-containing substances may be used as brighteners. The brighteners may for example be selected from the group comprising the sodium salt of 3-(benzthiazolyl-2-thio)-propylsulfonic acid, the sodium salt of 3-mercaptopropane-1-sulfonic acid, the sodium salt of ethylenedithiodipropyl sulfonic acid, the disodium salt of bis-(p-sulfophenyl)disulfide, the disodium salt of bis-(ω-sulfobutyl)disulfide, the disodium salt of bis-(ω-sulfohydroxypropyl)-disulfide, the disodium salt of bis-(ω-sulfopropyl)disulfide, the disodium salt of bis-(ω-sulfopropyl)sulfide, the disodium salt of methyl-(ω-sulfopropyl) disulfide, the disodium salt of methyl-(ω-sulfopropyl) trisulfide, the potassium salt of O-ethyl-dithiocarbonic acid-S-(ω-sulfopropyl)-ester, thioglycolic acid, the disodium salt of thiophosphoric acid-O-ethyl-bis-(ω-sulfopropyl)ester, the trisodium salt of thiophosphoric acid tris-(ω-sulfopropyl) ester, and further similar compounds. The concentration of these substances in either one of the plating compositions lies in a range of from about 0.1 to about 100 mg/l.

Polymeric nitrogen compounds (such as polyamines or polyamides) or nitrogen-containing sulfur compounds such as thiourea derivatives or lactam alkoxylates such as those described in DE 38 36 521 C2, which is herein incorporated by reference, can be used as leveling agents. The concentration of these substances in either one of the plating compositions lies in a range of from about 0.1 to about 100 mg/l.

The wetting agents are usually oxygen-containing, high molecular compounds, for example carboxymethylcellulose, nonylphenol polyglycol ether, octandiol bis(polyalkylene glycol ether), octanol polyalkylene glycol ether, oleic acid polyglycol ester, polyethylene glycol polypropylene glycol copolymerisate, polyethylene glycol, polyethylene glycol dimethyl ether, polypropylene glycol, polyvinyl alcohol, β-naphthol polyglycol ether, stearic acid polyglycol ester, stearyl alcohol polyglycolether, and similar compounds. The wetting agents may be present in the composition in a concentration in a range of from about 0.005 to about 20 g/l, preferably from about 0.01 to about 5 g/l.

In general, the concentrations of levelers, brighteners, and wetting agents are set to a lower value in an X- (bridge-) plating composition than in a conformal plating composition.

In a further preferred embodiment of the present invention, the substrate is a circuit carrier, a printed circuit board or chip carrier for example, wherein the circuit carrier has holes therein. The printed circuit board may be a double-sided board or a multilayer board having a plurality of inner layers which comprise electrical functionality including electrical circuitry therein. The printed circuit board or other circuit carrier typically comprises on the outer sides and on the holes walls a base metal, preferably copper, layer. The holes may have a diameter of as low as 0.2 mm or may be as large as 2 mm, or the diameter may even be smaller or greater. The board thickness and thus hole length (in case of through holes) may be as low as 0.5 mm and as large as 5 mm or the board thickness may even be smaller or greater. The distance (pitch) of holes to each other may be as low as 0.5 mm or as large as 50 mm or even smaller or greater. The holes may be arranged in a matrix (cluster) of for example 20 by 20 $mm^2$.

In general, any other substrates may be electroplated with the method and apparatus of the invention, including complex-shaped substrates like plastic or metal parts used in the sanitary, furniture, automotive, or mechanical engineering industry for example.

The following figures and examples explain the invention in more detail. These figures and examples exclusively serve the understanding and do not limit the scope of the invention as claimed.

BRIEF DESCRIPTION OF THE DRAWING FIGURES

FIG. 14 shows a diagram indicating copper thickness on the board surface in a hole region and outside the hole region.

DETAILED DESCRIPTION OF THE PREFERRED EMBODIMENTS

Elements having the same function are designated with the same reference signs in the figures.

Figure 1:
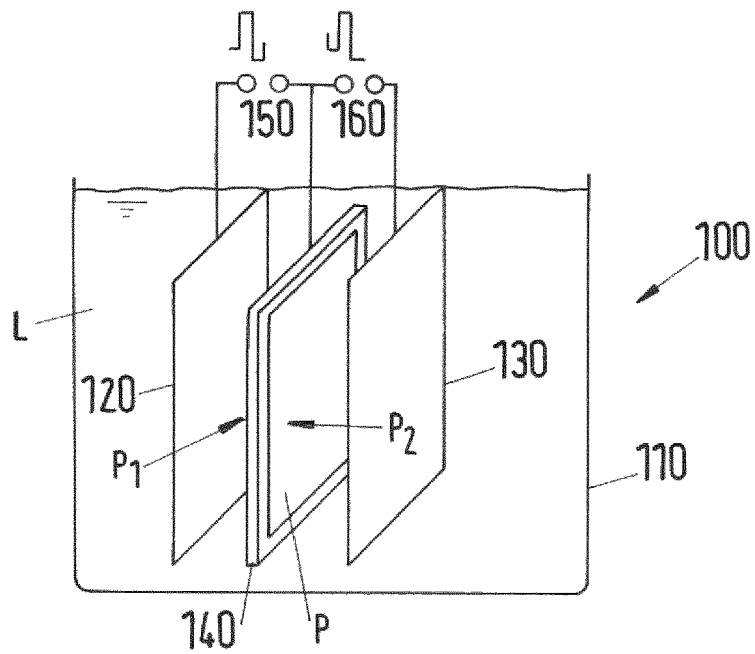
FIG. 1 shows an apparatus of the invention in a first embodiment in a schematic perspective view.
Figure 2:
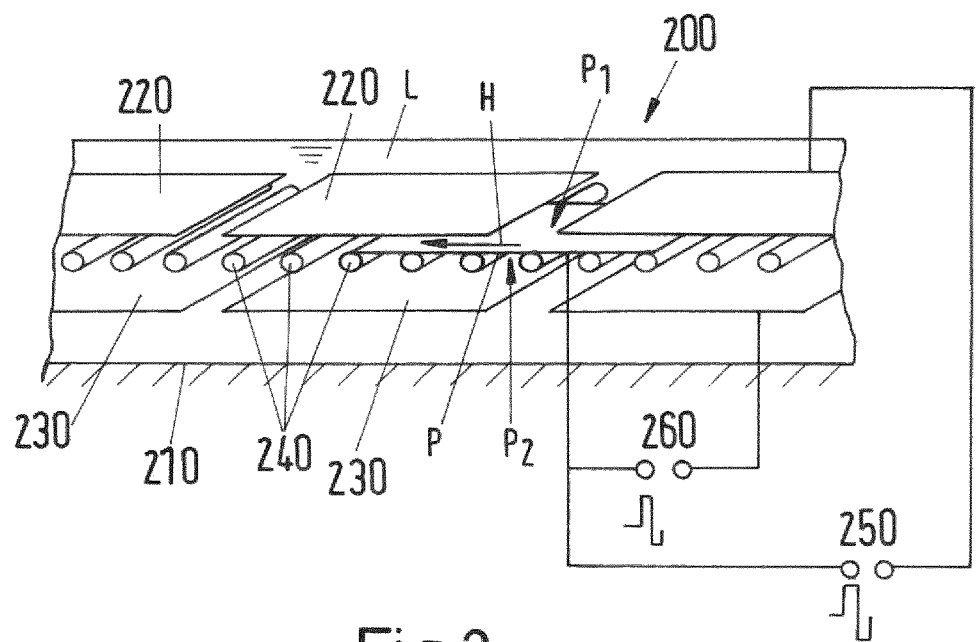
FIG. 2 shows an apparatus of the invention in a second embodiment in a schematic perspective view.

The apparatus of the invention may be of a vertical type of treatment apparatus 100 (FIG. 1) or a horizontal (conveyorized) type of apparatus 200 (FIG. 2).

In the vertical type of apparatus 100 (FIG. 1) the substrate P, a printed circuit board for example, which has a first surface (side) $P_1$ and a second surface (side) $P_2$, is vertically immersed into the treatment liquid L contained in a container 110. The board is provided with through holes and/or blind holes. The substrate is placed between two counter electrodes 120, 130 (anodes) which are also oriented in a vertical direction and which are arranged facing each other: a first counter electrode 120 facing the first surface $P_1$ of the board and a second counter electrode 130 facing the second surface $P_2$ of the board. Both, the board and the counter electrodes are immersed into the treatment liquid. The board is held by a holding means 140 like a frame or a claw. The counter electrodes may for example be made from expanded metal like from expanded titanium which is surface coated with a noble metal. The treatment liquid may be a copper electroplating liquid like a sulfuric acid electroplating liquid containing copper sulfate, sulfuric acid, sodium chloride, and organic additives in water. In addition, the apparatus may contain a heating, nozzles for injecting air into the liquid, nozzles for injecting treatment liquid into the container, stirring means, filtering means, and the like (not shown). Each one of the counter electrodes and the board are electrically connected to a respective current source like a rectifier. A first counter electrode 120 and the board are connected to a first rectifier 150 (represented by its electrical contacts) and a second counter electrode 130 and the board are connected to a second rectifier 160 (represented by its electrical contacts). The current sources independently apply pulse currents to the counter electrodes and respective surfaces $P_1$, $P_2$ of the board. Each one of the pulse currents has a defined pulse shape and frequency.

The horizontal type apparatus 200 (FIG. 2) also comprises a container 210 holding the treatment liquid. Two rows of counter electrodes 220, 230 (anodes) are arranged one after the other in the conveyance direction in the container. A space is formed between the rows wherein a board P having two surfaces (sides) $P_1$, $P_2$ and being provided with through holes and/or blind holes, is conveyed through the container on a horizontal conveying path. The board is conveyed using rollers 240. The rollers transport the board in a horizontal direction (arrow H) through the container. The container is preferably flooded with the treatment liquid L so that the counter electrodes and the board are completely immersed in the treatment liquid. In this case too, each one of the counter electrodes and the board are electrically connected to a respective current source like a rectifier (well-known in the art). The first counter electrodes 220 and the board are connected to a first rectifier 250 (represented by its electrical contacts) and the second counter electrodes 230 and the board are connected to a second rectifier 260 (represented by its electrical contacts). The current sources independently apply pulse currents to the counter electrodes and surfaces $P_1$, $P_2$ of the board. Each one of the pulse currents has a defined pulse shape and frequency.

Figure 3:
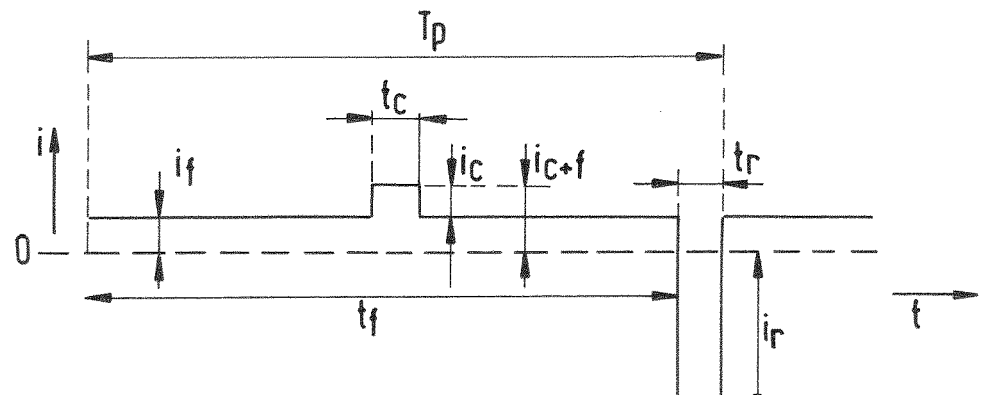
FIG. 3 shows a forward-reverse pulse current sequence according to the present invention being applied to one surface of a flat substrate.

In a first embodiment of the method of the present invention, the pulse shape of the pulse current applied to the board (or a flat substrate having any other shape than being board-shaped) is shown in FIG. 3. This diagram shows the current i over time t with cathodic current being above the zero current line (0) and anodic current being below the zero current line (0). The pulse current sequence shown represents one periodic cycle having a cycle time $T_p$. A plurality of such cycles (forward-reverse pulse periods) follow each other. In this embodiment a forward pulse having a forward pulse peak current $i_f$ is applied during a forward pulse duration $t_f$ and a reverse pulse having a reverse pulse peak current $i_r$ is applied during a reverse pulse duration $t_r$. Furthermore, during the forward pulse duration $t_f$ a superposing cathodic pulse having a superposing cathodic pulse duration $t_c$ is applied. This superposing cathodic pulse has a superposing cathodic pulse peak current $i_c$ which adds to the forward pulse peak current $i_f$ to yield an overall cathodic peak current $i_{c+f}$. This pulse current sequence repeats permanently at a frequency f, so that the period $T_p = 1/f$.

The pulsed current applied to the substrate P is provided by rectifiers 150, 160, 250, 260 which are accordingly programmed to provide such pulse current sequence. This current sequence is applied to the substrate and counter electrodes 120, 130, 220, 230 being arranged opposite this substrate.

As a flat substrate like a board P is used, the two board's surfaces $P_1$, $P_2$ are independently loaded with forward-reverse pulse current sequences by applying a first forward-reverse pulse current sequence to a first counter electrode 120, 220 and a first surface $P_1$ of the board and by applying a second forward-reverse pulse current sequence to a second counter electrode 130, 230 and a second surface $P_2$ of the board. The first forward-reverse pulse current sequence applied to the first side of the board is shown in the upper graph of FIG. 4, whereas the second forward-reverse pulse current sequence applied to the second side of the board is shown in the lower graph of FIG. 4.

The first forward-reverse pulse current sequence comprises a first forward pulse having a first forward pulse duration $t_{f1}$ and a first forward pulse peak current $i_{f1}$ and a first reverse pulse having a first reverse pulse duration $t_{r1}$ and a first reverse pulse peak current $i_{r1}$. Furthermore, there is a first superposing cathodic pulse having a first superposing cathodic pulse duration $t_{c1}$ and a first superposing cathodic pulse peak current $i_{c1}$. The first superposing cathodic pulse peak current $i_{c1}$ adds to the first forward pulse peak current $i_{f1}$ to yield a first overall cathodic peak current $i_{c+f1}$. The second forward-reverse pulse current sequence comprises a second forward pulse having a second forward pulse duration $t_{f2}$ (not shown) and a second forward pulse peak current $i_{f2}$ and a second reverse pulse having a second reverse pulse duration $t_{r2}$ and a second reverse pulse peak current $i_{r2}$. Furthermore, there is a second superposing cathodic pulse having a second superposing cathodic pulse duration $t_{c2}$ and a second superposing cathodic pulse peak current $i_{c2}$. The second superposing cathodic pulse peak current $i_{c2}$ adds to the second forward pulse peak current $i_{f2}$ to yield a second overall cathodic peak current $i_{c+f2}$. Both pulse current sequences are offset by a phase shift $\varphi_s$ of 180°, such that the first reverse pulse is offset to the second reverse pulse by 180°. Furthermore, the first superposing cathodic pulse of the first pulse current sequence and the second reverse pulse of the second pulse current sequence are applied simultaneously and the second superposing cathodic pulse of the second pulse current sequence and the first reverse pulse of the first pulse current sequence are also applied simultaneously ($\varphi_r = 0°$), because the superposing cathodic pulse and the reverse pulse within the same forward-reverse pulse current sequence are offset relative to each other by an angular offset $\xi_c = 180°$ and because $t_{c1} = t_{r2}$ and $t_{c2} = t_{r1}$. As will be shown hereinafter, this type of pulse current treatment is very advantageous for X- (bridge-) plating. If $t_{c1}$ would not be equal to $t_{r2}$ and $t_{c2}$ would not be equal to $t_{r1}$, the reverse and superposing cathodic pulses would not completely overlap.

Figure 5:
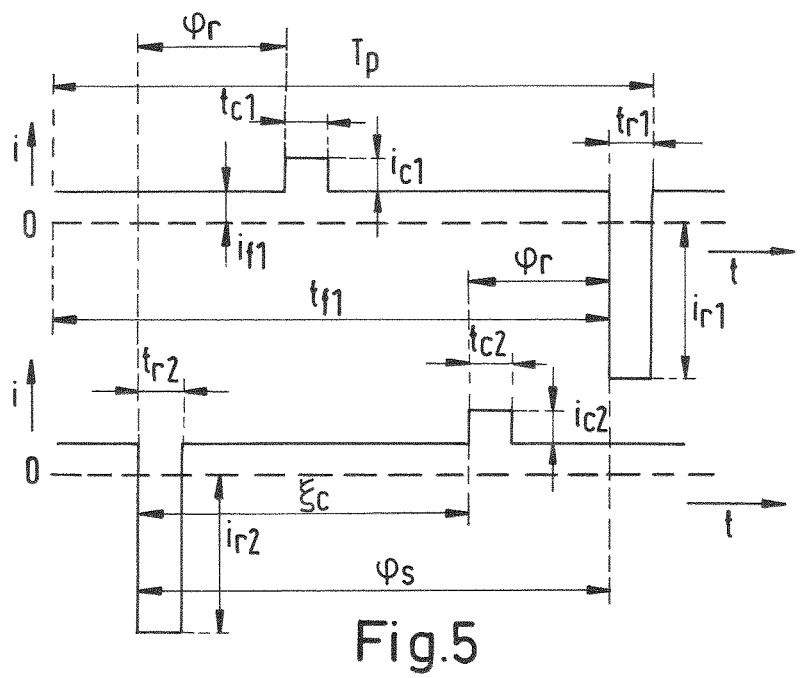
FIG. 5 shows forward-reverse pulse current sequences in a second embodiment of the invention, each one being applied to one of the sides of the flat substrate.

In a further embodiment (FIG. 5), each one of both pulse current sequences comprises a forward pulse, a reverse pulse, and a superposing cathodic pulse. The angular offset $\xi_c$ between the superposing cathodic pulse and the reverse pulse in a pulse current sequence is 110°. The phase shift $\varphi_s$ between the first and the second forward-reverse pulse current sequences is less than 180°, 150° for example.

In yet a further embodiment (FIG. 6), each one of both forward-reverse pulse current sequences comprises a forward pulse and a reverse pulse, but no superposing cathodic pulse. These forward-reverse pulse current sequences may be applied in a second method section period, after, in a first method section period, the forward-reverse pulse current sequences having superposing cathodic pulses (FIGS. 4, 5) have been applied to provide X- (bridge-) plating of through holes, so that thereafter the through holes may be filled efficiently. In this case, the phase shift $\varphi_s$ between the reverse pulses of the two forward-reverse pulse current sequences is preferably 180°.

Figure 7:
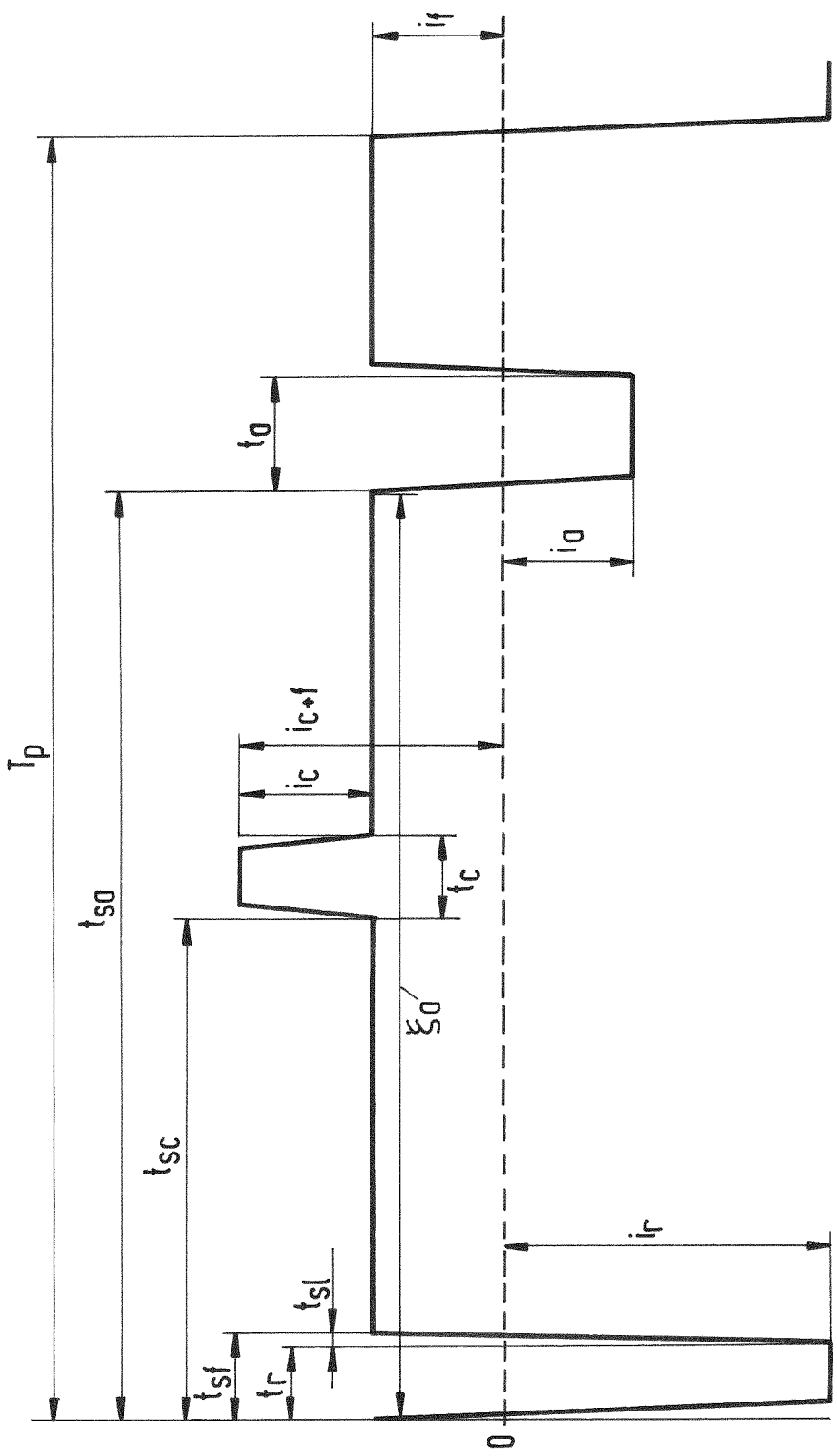
FIG. 7 shows a forward-reverse pulse current sequence in a third embodiment of the invention.

In a further method embodiment of the present invention a further (third) pulse is applied, in addition to the forward pulse, the reverse pulse, and the superposing cathodic pulse. This pulse current sequence is shown in FIG. 7. Furthermore in this case, the real pulse track exhibiting a finite time period for the rise from one current level to another current level is shown. Therefore each pulse has a rise time and a decay time, indicated as a slope, expressed in [A/s]. This slope may have a maximum value depending on electrical conditions of the apparatus setup. The respective rise and decay times (slope durations) of the reverse pulse is accordingly shown to be $t_{sl}$. Taking the start time for the reverse pulse to be at 0 s, FIG. 7 further shows a couple of further parameters, i.e., the start time for the forward pulse $t_{sf}$, the start time for the superposing cathodic pulse $t_{sc}$, and the start time for the additional (third) pulse $t_{sa}$.

EXAMPLE 1

In a setup using a horizontal conveyorized plating apparatus with a plating liquid flow of 15 m³/h such as shown in FIG. 2, copper deposition was performed to a printed circuit board having through holes. The board was held in the apparatus with clamps at one clamping edge thereof wherein the clamps also provided electrical contact to the two sides of the board. Each one of the two sides were electrically connected individually and powered from a respective rectifier independently with their own forward-reverse pulse current sequences. The rectifiers were driven by respective computer controlled devices to generate the forward-reverse pulse sequences. The copper plating bath was a sulfuric acid plating bath containing copper sulfate, sulfuric acid, sodium chloride and commonly used organic additives. The boards were provided with a thin copper layer all over the outer surface and the through hole walls. The through holes had a diameter of 0.2 mm and a length (thickness of the board) of 0.8 mm. 800 through holes were arranged in matrices (clusters) in an area of 20 mm by 20 mm with a pitch of 0.5 mm. A couple of these matrices were arranged on the board at various distances to the edge of the board.

Copper deposition was performed to effect X-plating, i.e., depositing copper in the through holes to generate a plug in the center thereof. Copper deposition was performed by applying a forward-reverse pulse current sequence to each one of the surfaces of the board, wherein the two pulse current sequences were phase shifted relative to each other by $\varphi_s$=180°, i.e., the start time of the first reverse pulse was offset by 180° relative to the start time of the second reverse pulse. Furthermore, as the angular offset $\xi_c$ between the superposing cathodic pulses and the reverse pulses in the same first or second forward-reverse pulse current sequence was 180°, the start time of the first superposing cathodic pulse was at the same time as the start time of the second reverse pulse.

Figure 8:
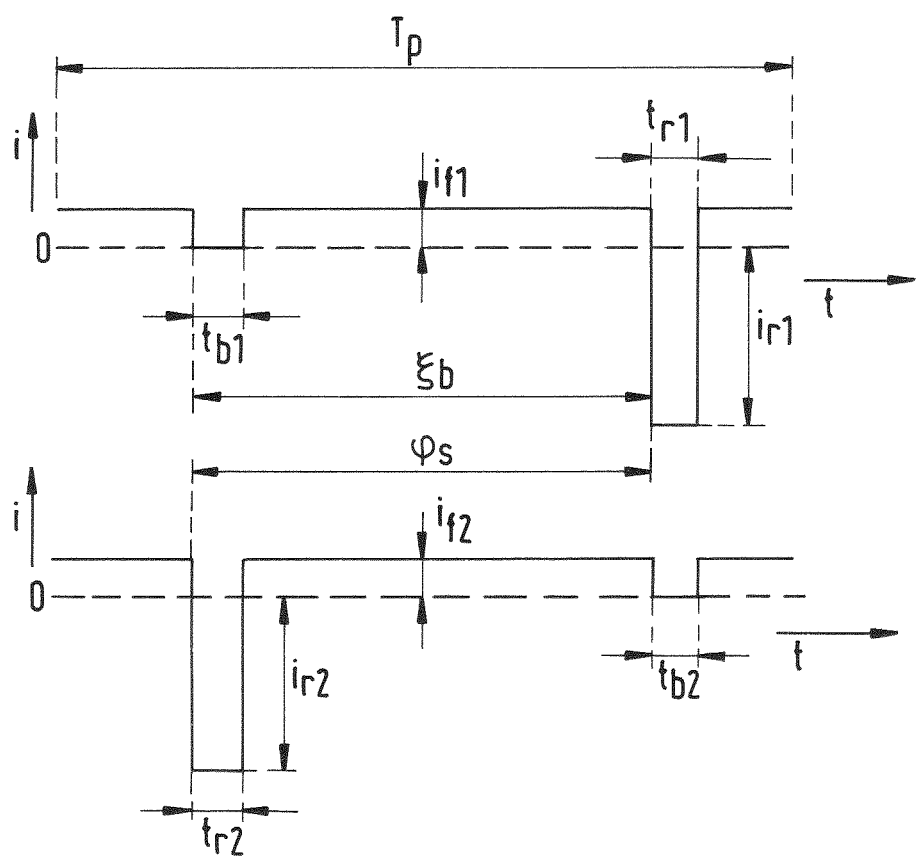
FIG. 8 shows a forward-reverse pulse current sequence having no superposing cathodic pulse, but having a pulse break.

In a first experiment, deposition was performed with conventional forward-reverse pulse current sequences for both surfaces of the board, each one having, in each pulse sequence cycle (forward-reverse pulse period), one forward pulse, one reverse pulse, and one pulse break during which no current flows (Plating Condition 1). The first pulse break of the first forward-reverse pulse current sequence was applied at the same time as the second reverse pulse of the second forward-reverse pulse current sequence and vice versa. A diagram showing these pulse current sequences is shown in FIG. 8. The first pulse current sequence is shown in the upper diagram and the second pulse current sequence is shown in the lower diagram. The parameters for these pulse current sequences are given in Table 1.

Figure 6:
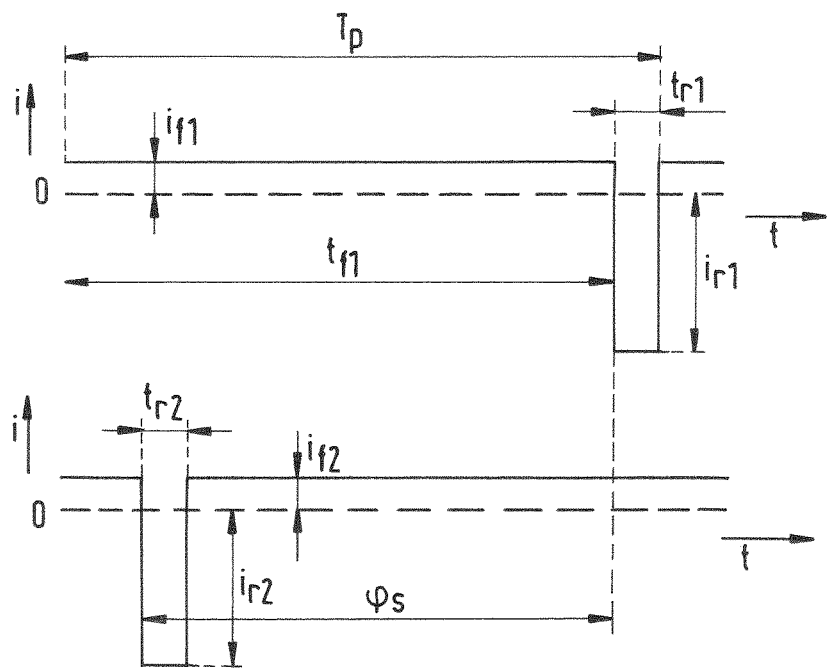
FIG. 6 shows forward-reverse pulse current sequences having no superposing cathodic pulse.

In a second experiment, metal deposition was performed with other conventional forward-reverse pulse current sequences each one having, in each pulse sequence cycle (forward-reverse pulse period), one forward pulse and one reverse pulse, but no pulse break (Plating Condition 2). A diagram showing these pulse current sequences is shown in FIG. 6. The parameters for these pulse current sequences are given in Table 1.

Figure 4:
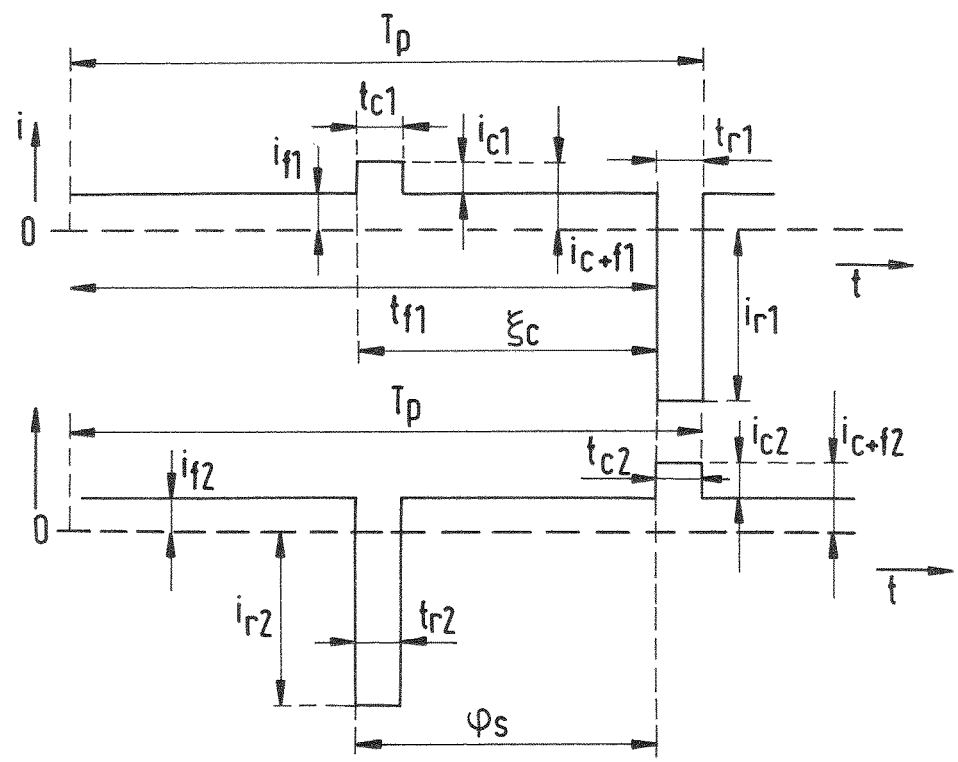
FIG. 4 shows forward-reverse pulse current sequences in a first embodiment of the invention, a first one of these forward-reverse pulse current sequences being applied to a first side of a flat substrate and a second one of these forward-reverse pulse current sequences being applied to a second side of the flat substrate.

In a third experiment according to the present invention, metal deposition was performed with forward-reverse pulse current sequences each one having, in each pulse sequence cycle (forward-reverse pulse period), one forward pulse, one reverse pulse, and one superposing cathodic pulse (Plating Condition 3). A diagram of such pulse current sequences is shown in FIG. 4. The parameters for these forward-reverse pulse current sequences are given in Table 1.

Figure 9:
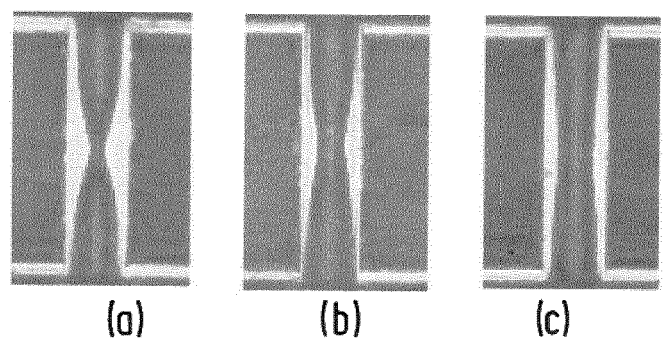
FIG. 9 shows photographs of coppered through holes obtained with a forward-reverse pulse current sequence having no superposing cathodic pulse, but a pulse break.

Results:

With the conventional forward-reverse pulse current sequence having a pulse break (first experiment, Plating Condition 1), marked differences of X-plating in the through holes were observed depending from the location of the through holes on the board: The through holes which were positioned nearest to the clamping edge of the board (Location 1: at 170 mm from the edge of the board opposing the clamping edge) were not yet plugged with copper in the center thereof while thickening of the copper layer in the center of the holes took place to some extent (FIG. 9a). The through holes located nearer to the edge of the board which was opposing to the clamping edge (Location 2: at 85 mm from the edge of the board opposing the clamping edge) experienced even less coppering so that only little thickening of the copper layer in the center of the holes took place (FIG. 9b). The through holes located in the vicinity of the edge of the board opposing to the clamping edge (Location 3: at 10 mm distance from the edge of the board opposing the clamping edge) did not show much coppering. A plug has not yet formed at all and thickening was almost not observed (FIG. 9c). Therefore, metal deposition is differing between the locations markedly.

Figure 10:
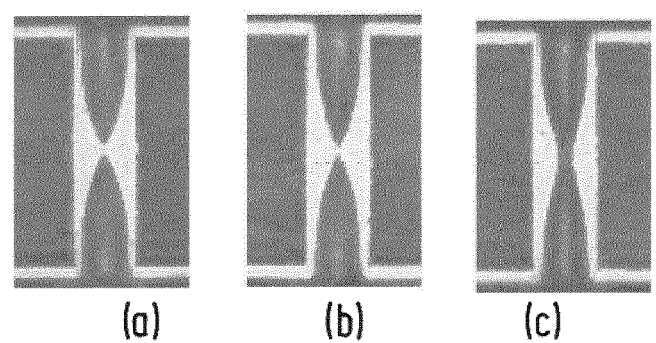
FIG. 10 shows photographs of coppered through holes obtained with a forward-reverse pulse current sequence having no superposing cathodic pulse and no pulse break.

With the conventional forward-reverse pulse current sequence having no pulse break (second experiment, Plating Condition 2), plug formation took place more distinctly at least in those holes which were at Location 1 and at Location 2 (FIGS. 10*a*, 10*b*). The holes located near the edge of the board remote from the clamping location (Location 3) showed marked thickening of the copper layer in the center of the holes, but coppering did not result in plug formation (FIG. 10*c*). Therefore, marked differences were still observed while plug formation was better than with the first experiment.

Figure 11:
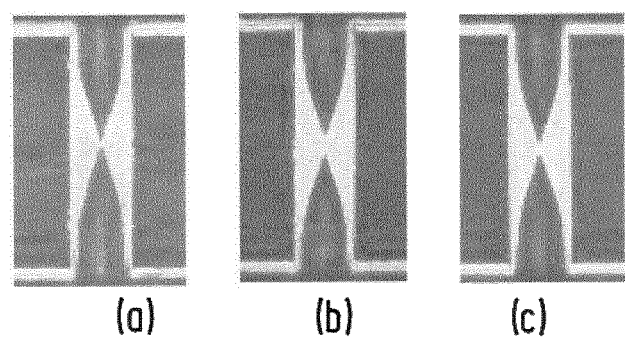
FIG. 11 shows photographs of coppered through holes obtained with a forward-reverse pulse current sequence having a superposing cathodic pulse.

With the forward-reverse pulse current sequences having a superposing cathodic pulse according to the invention (third experiment, Plating Condition 3) almost no differences were observed with plug formation in the center of the holes irrespective of whether the holes were located at Location 1, Location 2, or Location 3 (FIG. 11*a*: Location 1; FIG. 11*b*: Location 2, FIG. 11*c*: Location 3).

EXAMPLE 2

Under the setup conditions of Example 1 (horizontal conveyorized plating line) with a plating liquid flow of 9 m³/h another experiment was performed showing superior results as regards uniformity of copper on the surface of a printed circuit board between through holes. A comparison was made between the copper thickness obtained between through holes arranged at a high density hole pitch (0.5 mm) and through holes arranged at a low density hole pitch (2.0 mm). Comparison was also made for different current conditions:

Plating Condition 1: DC plating (DC=direct current).

Plating Condition 2: forward-reverse pulse current sequences with pulse break (0 A/dm²), but without superposing cathodic pulse, corresponding to a pulse current sequence as is shown in FIG. 8.

Plating Condition 3: forward-reverse pulse current sequences with a superposing cathodic pulse, but without pulse break, corresponding to a pulse current sequence as shown in FIG. 4.

The board parameters were as follows: panel thickness: 0.8 mm; hole diameters 0.2 mm and 0.6 mm; hole pitch: 0.5 mm and 2.0 mm; block area (area of hole matrix): 20 mm by 20 mm.

DC current was set to 2 A/dm² (Plating Condition 1). All other plating parameters are given in Table 2.

Figure 12:
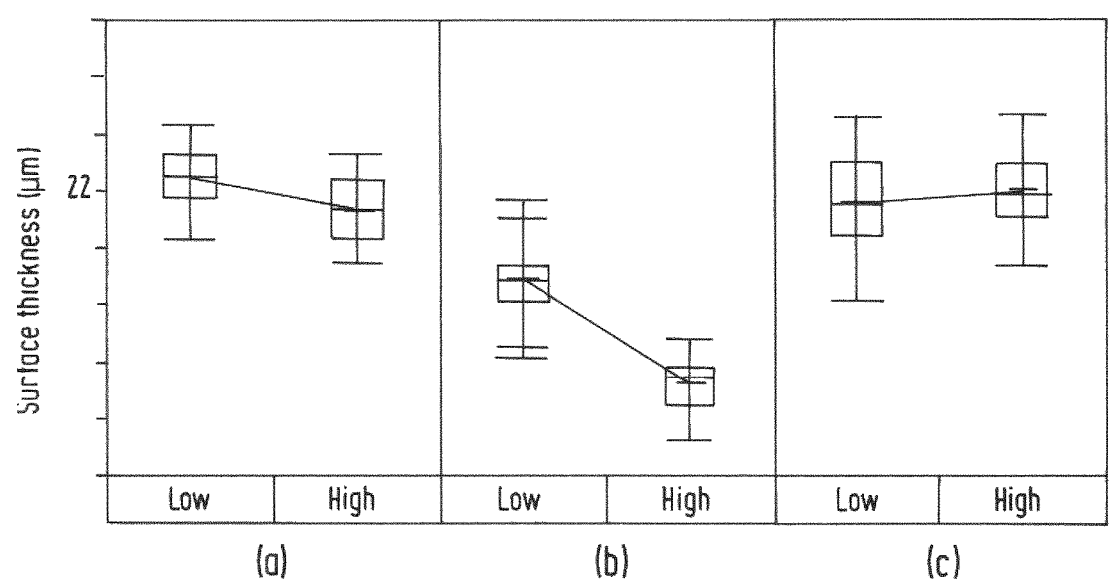
FIG. 12 shows diagrams of copper surface thickness variations at different conditions.

Results:

Copper thickness was measured on the surface of the board between the through holes and statistically evaluated. The values for those measuring positions where the hole pitch was small (pitch: 0.5 mm; high hole density) and where the hole pitch was large (pitch: 2.0 mm; low hole density) were determined separately. The results of these measurements are shown in FIG. 12:

FIG. 12*a* shows the results of copper surface thickness variation obtained with DC plating (2 A/dm²) at low and high hole density areas ("Low" and "High", resp.), Plating Condition 1.

FIG. 12*b* shows the results of copper thickness variation obtained with forward-reverse pulse current sequences and with pulse break but without superposing cathodic pulse, Plating Condition 2. Again, results obtained at low and high hole density areas ("Low" and "High", resp.) are shown.

FIG. 12*c* shows the results of copper thickness variation obtained with forward-reverse pulse current sequences, without pulse break, but with superposing cathodic pulse, Plating Condition 3. Again, results obtained at low and high hole density areas ("Low" and "High", resp.) are shown.

Large relative variation in copper surface thickness was obtained with the pulse conditions using a forward-reverse pulse current sequence with pulse break and without superposing cathodic pulse (Plating Condition 2). Surface thickness variation is lower if a superposing cathodic pulse is used (Plating Condition 3). DC conditions are shown for comparison only (Plating Condition 1). DC conditions are not acceptable if an even metal thickness is to be achieved on the surface in high and low hole density areas.

Figure 13:
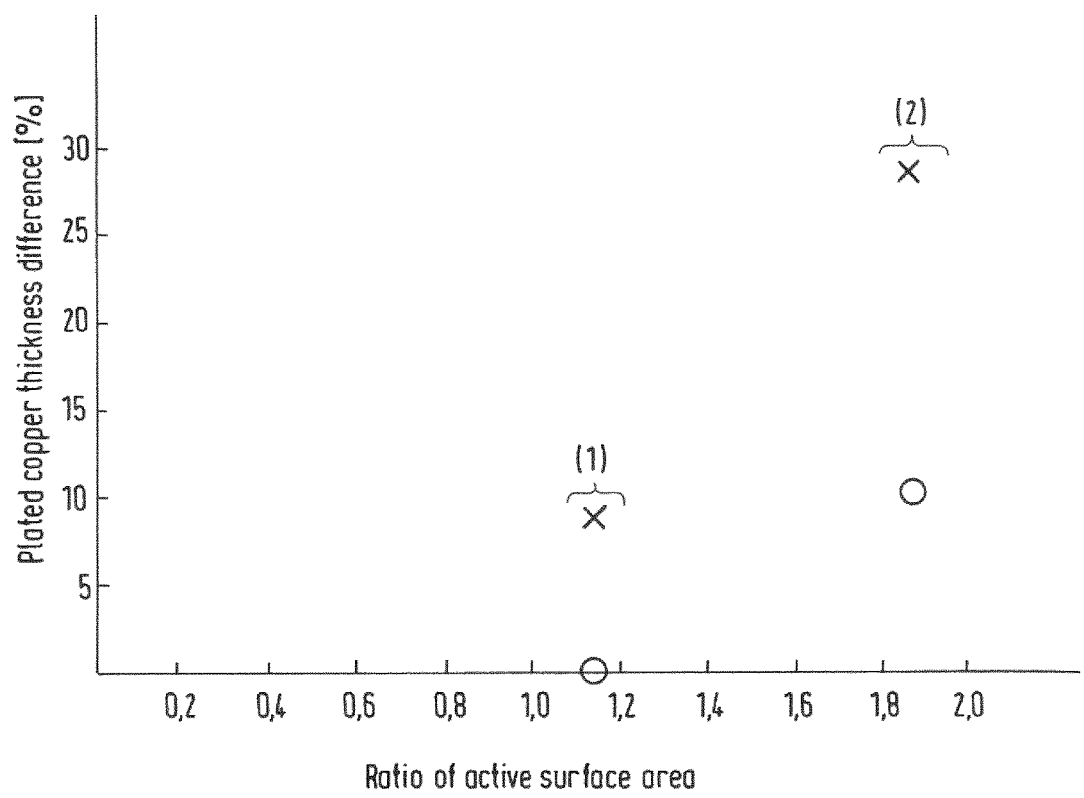
FIG. 13 shows a diagram indicating the dependency of the plated copper thickness between the surface of the board and surface of the through holes, relating to the plated surface copper thickness [%], from the ratio of the active surface area on the surface of the board to the surface area on the through hole walls.

In a further diagram (FIG. 13) a dependency of the plated surface copper thickness variation between the surface of the board (area without through holes, plain area) and the surface area including through holes, relating to the ratio of the active surface area between the surface of the board (area without through holes, plain area) to the real surface area in the through hole area region (board surface area plus surface area of the through hole walls) is shown for different hole diameters (0.2 mm: indicated by (1); 0.6 mm, indicated by (2)), different hole densities (hole pitches: 0.5 mm, indicated by (2); 2.0 mm, indicated by (1)), and for different plating conditions (Plating Condition 2 of Table 2, indicated by 'x'; Plating Condition 3 of Table 2, indicated by 'o'). The data given in Table 2 indicated by 1) and 2) correspond to substrates with hole diameters and hole densities indicated by (1) and (2), respectively. Accordingly, copper thickness as plated on the outer surface of the board in a region without through holes is compared to copper thickness as plated on the outer surface of the board in a region comprising through holes.

From the diagram it is apparent that a relatively small copper thickness difference between the plain area (without through holes) and the surface area where through holes were located was achieved if Plating Condition 3 was used. This effect was more pronounced if substrates with large holes and a large hole pitch were plated.

EXAMPLE 3

Under the setup conditions of Example 1 (horizontal conveyorized plating line) with a plating liquid flow of 9 m³/h, another experiment was performed showing superior results as regards uniformity of copper on the surface of a printed circuit board in an area where through holes were located (thickness measured between through holes) and outside this area, i.e., in regions where no through holes were located.

The board parameters were as follows: panel thickness: 1.5 mm; hole diameters 0.4 mm and 0.6 mm; hole pitch: 0.2 mm, 0.4 mm, and 0.8 mm; block area (area of hole matrix): 20 mm by 20 mm.

Comparison is also made for different current conditions (the pulse consecutions and frequencies of all forward-reverse currents herein below were set to be identical):

Plating Condition 1: forward-reverse pulse current sequences on both sides of the board, each sequence without pulse break and without superposing cathodic pulse, the first reverse pulse on one side of the board being offset to the second reverse pulse on the other side thereof by $\varphi_s=187°$.

Plating Condition 2: forward-reverse pulse current sequences on both sides of the board, each sequence comprising a superposing cathodic pulse, but no pulse break, the first superposing cathodic pulse on one side of the board being offset to the second reverse pulse on the other side thereof and vice versa by $\varphi_r=7°$. The phase shift between the first and second forward-reverse pulse current sequences was set to $\varphi_s=187°$. The angular offsets between the reverse pulses and the superposing cathodic pulses within the first forward-reverse pulse current sequence and within the second forward-reverse pulse current sequence, respectively, were set to be $\xi_c=180°$ in each case.

The parameters for the forward-reverse pulse current sequences are given in Table 3.

Results:

Copper thickness was measured on the surface of the board between the through holes on the one hand and in regions outside this area, i.e., in regions where no through holes were located. The data retrieved were statistically evaluated. The values for those measuring positions where through holes were present on the one hand and where no through holes were present on the other hand were determined separately. The results of these measurements are shown in FIG. 14:

Irrespective of the application of superposing cathodic pulses or not in the forward-reverse pulse current sequences, copper thickness in the area where through holes are present increases when through hole pitch increases. There is no remarkable effect on copper thickness due to the through hole diameter.

A remarkable increase of copper thickness was achieved when the forward-reverse pulse current sequences were applied which additionally included a superposing cathodic pulse as compared to when no such pulse was additionally included into the sequence. This result clearly shows that the advantageous effect of providing such superposing cathodic pulse in the forward-reverse pulse current sequence is not only effective if the phase shift $\varphi_s$ is 180°, but also when it is substantially higher, like 187° in this case. It has to be noted that this favourable effect is achieved by setting $\varphi_r$ to be greater than 0°, i.e., 7° in this case.

TABLE 1

Pulse Parameters for Example 1

| | Plating Condition 1: Forward-reverse pulse current sequence, with pulse break, no superposing cathodic pulse | Plating Condition 2: Forward-reverse pulse current sequence, no pulse break, no superposing cathodic pulse | Plating Condition 3: Forward-reverse pulse current sequence, no pulse break, with superposing cathodic pulse |
|---|---|---|---|
| Forward current density $I_f$ [A/dm$^2$] | 3.89 | 3.68 | 2.78 |
| Forward pulse duration $t_f$ [ms] | 76 | 76 | 76 |
| Reverse current density $I_r$ [A/dm$^2$] | 40 | 40 | 40 |
| Reverse pulse duration $t_r$ [ms] | 4 | 4 | 4 |
| Overall cathodic peak current density $I_{c+f}$ [A/dm$^2$] | ./. | ./. | 20 |
| Superposing cathodic pulse duration $t_c$ [ms] | ./. | ./. | 4 |
| Superposing cathodic pulse duration start [ms] | ./. | ./. | 36 |
| Pulse period $T_p$ [ms] | 80 | 80 | 80 |
| Start pulse break [ms] | 36 | ./. | ./. |
| Pulse break duration $t_b$ | 4 | ./. | ./. |
| Effective (= average) current density $I_{av}$ [A/dm$^2$] | 1.5 | 1.5 | 1.5 |
| Phase shift $\varphi_s$ between current sequences of both sides | 180° | 180° | 180° |
| Plating time [min] | 30 | 30 | 30 |
| Phase shift $\varphi_r$ between reverse pulse and superposing cathodic pulse of different current sequences | ./. | ./. | 0° |

TABLE 2

Pulse Parameters for Example 2

| | Plating Condition 2: Forward-reverse pulse current sequence with pulse break, no superposing cathodic pulse | Plating Condition 3: Forward-reverse pulse current sequence, no pulse break, with superposing cathodic pulse |
|---|---|---|
| Forward current density $I_f$ [A/dm$^2$] | 1) 4.44<br>2) 7.74 | 1) 3.33<br>2) 7.21 |
| Forward pulse duration $t_f$ [ms] | 1) 76<br>2) 78 | 1) 76<br>2) 78 |
| Reverse current density $I_r$ [A/dm$^2$] | 1) 40<br>2) 14 | 1) 40<br>2) 14 |
| Reverse pulse duration $t_r$ [ms] | 1) 4<br>2) 2 | 1) 4<br>2) 2 |
| Overall cathodic peak current density $I_{c+f}$ [A/dm$^2$] | 1) ./.<br>2) ./. | 1) 20<br>2) 20 |
| Superposing cathodic pulse duration $t_c$ [ms] | 1) ./.<br>2) ./. | 1) 4<br>2) 2 |
| Superposing cathodic pulse duration start [ms] | 1) ./.<br>2) ./. | 1) 36<br>2) 38 |
| Pulse period $T_p$ [ms] | 1) 80<br>2) 80 | 1) 80<br>2) 80 |
| Start pulse break [ms] | 1) 36<br>2) 38 | 1) ./.<br>2) ./. |
| Pulse break duration $t_b$ | 1) 4<br>2) 2 | 1) ./.<br>2) ./. |
| Effective (= average) current density $I_{av}$ [A/dm$^2$] | 1) 2<br>2) 7 | 1) 2<br>2) 7 |
| Phase shift $\varphi_s$ between current sequences of both sides | 1) 180°<br>2) 180° | 1) 180°<br>2) 180° |
| Phase shift $\varphi_r$ between reverse pulse and superposing cathodic pulse of different current sequences | ./. | 0° |
| Plating time [min] | 36 | 36 |

TABLE 3

Pulse Parameters for Example 3

| | Plating Condition 1: Forward-reverse pulse current sequence, no pulse break, no superposing cathodic pulse | Plating Condition 2: Forward-reverse pulse current sequence, no pulse break, with superposing cathodic pulse |
|---|---|---|
| Forward current density $I_f$ [A/dm²] | 7.8 | 7.3 |
| Forward pulse duration $t_f$ [ms] | 76 | 73 |
| Reverse current density $I_r$ [A/dm²] | 20 | 20 |
| Reverse pulse duration $t_r$ [ms] | 3 | 3 |
| Overall cathodic peak current density $I_{c+f}$ [A/dm²] | ./. | 20 |
| Superposing cathodic pulse duration $t_c$ [ms] | ./. | 3 |
| Superposing cathodic pulse duration start [ms] | ./. | 36.5 |
| Pulse period $T_p$ [ms] | 79 | 79 |
| Effective (= average) current density $I_{av}$ [A/dm²] | 6 | 6 |
| Phase shift $\varphi_r$ between reverse pulse and superposing cathodic pulse of different current sequences | ./. | 7° |
| Plating time [min] | 26.7 | 26.7 |

LIST OF REFERENCE SIGNS

100, 200 electroplating apparatus
110 means for accommodating an electroplating liquid
120, 220 first counter electrode
130, 230 second counter electrode
140 means for holding the substrate
150 first means for electrically polarizing the substrate, rectifier
160 second means for electrically polarizing the substrate, rectifier
210 means for accommodating an electroplating liquid
250 first means for electrically polarizing the substrate, rectifier
260 second means for electrically polarizing the substrate, rectifier
f frequency
H transport direction
i current
$i_a$ third pulse peak current
$I_a$ third pulse peak current density
$i_c$ superposing cathodic pulse peak current
$I_c$ superposing cathodic pulse peak current density
$i_{c1}$ first superposing cathodic pulse peak current
$i_{c2}$ second superposing cathodic pulse peak current
$i_{c+f}$ overall cathodic peak current
$I_{c+f}$ overall cathodic peak current density
$i_{c+f1}$ first overall cathodic peak current
$i_{c+f2}$ second overall cathodic peak current
$i_f$ forward pulse peak current
$I_f$ forward pulse peak current density
$i_{f1}$ first forward pulse peak current
$i_{f2}$ second forward pulse peak current
$i_r$ reverse pulse peak current
$I_r$ reverse pulse peak current density
$i_{r1}$ first reverse pulse peak current
$i_{r2}$ second reverse pulse peak current
L electroplating/treatment liquid
P (flat) substrate, board
$P_1$ first substrate surface
$P_2$ second substrate surface
t time
$t_a$ third pulse duration
$t_b$ pulse break duration
$t_c$ superposing cathodic pulse duration
$t_{c1}$ first superposing cathodic pulse duration
$t_{c2}$ second superposing cathodic pulse duration
$t_f$ forward pulse duration
$t_{f1}$ first forward pulse duration
$t_{f2}$ second forward pulse duration
$T_p$ cycle time
$t_r$ reverse pulse duration
$t_{r1}$ first reverse pulse duration
$t_{r2}$ second reverse pulse duration
$t_{sa}$ start time of the third pulse
$t_{sb}$ start time of the pulse break
$t_{sc}$ start time of the superposing cathodic pulse
$t_{sf}$ start time of the forward pulse
$t_{sl}$ slope duration
$\xi_a$ angular offset between the reverse pulse and the third pulse within the same forward-reverse pulse current sequence
$\xi_b$ angular offset between the reverse pulse and the pulse break within the same forward-reverse pulse current sequence
$\xi_c$ angular offset between the reverse pulse and the superposing cathodic pulse within the same forward-reverse pulse current sequence
$\varphi_r$ phase shift between reverse pulse of first forward-reverse pulse current sequence and superposing cathodic pulse of second forward reverse pulse current sequence
$\varphi_s$ phase shift between forward-reverse pulse current sequences (between start times of reverse pulses applied to the two opposing sides of the substrate)

The invention claimed is:

1. A method for electroplating a metal onto a substrate (P), wherein said substrate (P) is a flat substrate having opposing first and second substrate surfaces ($P_1$, $P_2$), said method comprising:
   (a) providing said substrate (P), an electroplating apparatus (100, 200) comprising at least one counter electrode (120, 130; 220, 230), and an electroplating liquid (L);
   (b) bringing said substrate (P) with said opposing first and second substrate surfaces ($P_1$, $P_2$) and said at least one counter electrode (120, 130; 220, 230) into contact with said electroplating liquid (L);
   (c) electrically polarizing said first and second substrate surfaces ($P_1$, $P_2$) of said substrate (P) to effect metal deposition onto said first and second substrate surfaces ($P_1$, $P_2$) by feeding at least one first forward-reverse pulse current sequence each one being composed of successive first forward-reverse pulse periods to said first substrate surface ($P_1$) and at least one second forward-reverse pulse current sequence each one being composed of successive second forward-reverse pulse periods to said second substrate surface ($P_2$);
   (d) each one of said at least one first forward-reverse pulse current sequence at least comprising, in each one of first consecutive forward-reverse pulse periods, a first forward pulse generating a first cathodic current during a first forward pulse duration ($t_{f1}$) at said first substrate surface ($P_1$), said first forward pulse having a first forward pulse peak current ($i_{f1}$), and a first reverse pulse generating a first anodic current during a first reverse pulse duration ($t_{r1}$) at said first substrate surface ($P_1$), said first reverse pulse having a first reverse pulse peak current ($i_{r1}$); and each one of said at least one second forward-reverse pulse current sequence at least comprising, in each one of consecutive second forward-reverse pulse periods, a second forward pulse generating a second cathodic current during a second forward pulse duration ($t_{f2}$) at the second substrate surface ($P_2$), said second forward pulse having a second forward pulse peak current ($i_{f2}$), and a second reverse pulse generating a second anodic current during a second reverse pulse duration ($t_{r2}$) at the second substrate surface, said second reverse pulse having a second reverse pulse peak current ($i_{r2}$);

(e) wherein said first and second forward pulses are further superposed with a respective first or second superposing cathodic pulse having a respective first or second superposing cathodic pulse duration ($t_{c1}$, $t_{c2}$) which is shorter than said respective first or second forward pulse duration ($t_{f1}$, $t_{f2}$); and wherein a phase shift $\varphi_r$, between said first reverse pulse of said at least one first forward-reverse current sequence and said second superposing cathodic pulse of said at least one second forward-reverse current sequence is set to 0°±30°.

2. The method for electroplating a metal onto a substrate (P) according to claim 1, wherein said first and second forward-reverse pulse current sequences are offset to each other by a phase shift ($\varphi s$) of about 180°.

3. The method for electroplating a metal onto a substrate (P) according to claim 1, wherein the durations ($t_{r1}$, $t_{r2}$) of said first and second reverse pulses equal the respective durations ($t_{c1}$, $t_{c2}$) of said first and second superposing cathodic pulses.

4. The method for electroplating a metal onto a substrate (P) according to claim 1, wherein said first reverse pulse and said second superposing cathodic pulse are applied simultaneously and wherein said second reverse pulse and said first superposing cathodic pulse are applied simultaneously.

5. The method for electroplating a metal onto a substrate (P) according to claim 1, wherein the method further comprises, subsequent to performing said at least one first and second forward-reverse pulse current sequences in accordance with method steps (d) and (e) in a first method section period, applying at least one further first and second forward-reverse pulse current sequences, each one comprising a plurality of consecutive first or second forward-reverse pulse periods, respectively, wherein each one of said consecutive first and second forward-reverse pulse periods comprises a respective first or second forward pulse generating a cathodic current during a respective first or second forward pulse duration ($t_{f1}$, $t_{f2}$) at the respective first or second substrate surface ($P_1$, $P_2$), said respective first or second forward pulse having a respective first or second forward pulse peak current ($i_{f1}$,$i_{f2}$), and a respective first or second reverse pulse generating a respective first or second anodic current during a respective first or second reverse pulse duration ($t_{r1}$, $t_{r2}$) at the respective first or second substrate surface ($P_1$, $P_2$), said first and second reverse pulses having a respective first or second reverse pulse peak current ($i_{r1}$,$i_{r2}$), without superposing said respective first or second forward pulses with a respective first or second superposing cathodic pulse, in a second method section period.

6. The method for electroplating a metal onto a substrate (P) according to claim 5, wherein, in said second method section period, said first and second forward-reverse pulse current sequences are offset to each other by a phase shift ($\varphi s$) of about 180°.

7. The method for electroplating a metal onto a substrate (P) according to claim 5, wherein none of said at least one first and second forward-reverse pulse current sequences, either in one of said first and second method section periods or in both method section periods, comprise any method section period wherein current applied to said substrate (P) is set to zero.

8. The method for electroplating a metal onto a substrate (P) according to claim 1, wherein said metal is copper.

9. The method for electroplating a metal onto a substrate (P) according to claim 1, wherein the first forward-reverse pulse current sequences and the second forward-reverse pulse current sequences have the same frequency and same pulse train.

10. The method for electroplating a metal onto a substrate (P) according to claim 1, wherein at least one first counter electrode is arranged opposite the first substrate surface and wherein at least one second counter electrode is arranged opposite the second substrate surface.

11. The method for electroplating a metal onto a substrate (P) according to claim 9, wherein at least one first counter electrode is arranged opposite the first substrate surface and wherein at least one second counter electrode is arranged opposite the second substrate surface.

12. The method for electroplating a metal onto a substrate (P) according to claim 9, wherein the durations ($t_{r1}$, $t_{r2}$) of said first and second reverse pulses equal the respective durations ($t_{c1}$, $t_{c2}$) of said first and second superposing cathodic pulses.

13. The method for electroplating a metal onto a substrate (P) according to claim 10, wherein the durations ($t_{r1}$, $t_{r2}$) of said first and second reverse pulses equal the respective durations ($t_{c1}$, $t_{c2}$e) of said first and second superposing cathodic pulses.

14. The method for electroplating a metal onto a substrate (P) according to claim 9, wherein said first reverse pulse and said second superposing cathodic pulse are applied simultaneously and wherein said second reverse pulse and said first superposing cathodic pulse are applied simultaneously.

15. The method for electroplating a metal onto a substrate (P) according to claim 10, wherein said first reverse pulse and said second superposing cathodic pulse are applied simultaneously and wherein said second reverse pulse and said first superposing cathodic pulse are applied simultaneously.

16. The method for electroplating a metal onto a substrate (P) according to claim 9, wherein the method further comprises, subsequent to performing said at least one first and second forward-reverse pulse current sequences in accordance with method steps (d) and (e) in a first method section period, applying at least one further first and second forward-reverse pulse current sequences, each one comprising a plurality of consecutive first or second forward-reverse pulse periods, respectively, wherein each one of said consecutive first and second forward-reverse pulse periods comprises a respective first or second forward pulse generating a cathodic current during a respective first or second forward pulse duration ($t_{f1}$, $t_{f2}$) at the respective first or second substrate surface ($P_1$, $P_2$), said respective first or second forward pulse having a respective first or second forward pulse peak current ($i_{f1}$, $i_{f2}$), and a respective first or second reverse pulse generating a respective first or second anodic current during a respective first or second reverse pulse duration ($t_{r1}$, $t_{r2}$) at the respective first or second substrate surface ($P_1$, $P_2$), said first and second reverse pulses having a respective first or second reverse pulse peak current ($i_{r1}$, $i_{r2}$) without superposing said respective first or second forward pulses with a respective first or second superposing cathodic pulse, in a second method section period.

17. The method for electroplating a metal onto a substrate (P) according to claim 10, wherein the method further comprises, subsequent to performing said at least one first and second forward-reverse pulse current sequences in accordance with method steps (d) and (e) in a first method section period, applying at least one further first and second forward-reverse pulse current sequences, each one comprising a plurality of consecutive first or second forward-reverse pulse periods, respectively, wherein each one of said consecutive first and second forward-reverse pulse periods comprises a respective first or second forward pulse generating a cathodic current during a respective first or second forward pulse duration ($t_{f1}$, $t_{f2}$) at the respective first or second substrate surface ($P_1$, $P_2$), said respective first or second forward pulse having a respective first or second forward pulse peak current ($i_{f1}$, $i_{f2}$), and a respective first or second reverse pulse generating a respective first or second anodic current during a respective first or second reverse pulse duration ($t_{r1}$, $t_{r2}$) at the respective first or second substrate surface ($P_1$, $P_2$), said first and second reverse pulses having a respective first or second reverse pulse peak current ($i_{r1}$, $i_{r2}$), without superposing said respective first or second forward pulses with a respective first or second superposing cathodic pulse, in a second method section period.

* * * * *